(12) United States Patent
Kummel et al.

(10) Patent No.: US 8,637,344 B2
(45) Date of Patent: Jan. 28, 2014

(54) MULTI-RATE RESIST METHOD TO FORM ORGANIC TFT CONTACT AND CONTACTS FORMED BY SAME

(75) Inventors: Andrew C. Kummel, San Diego, CA (US); Jeongwon Park, Palo Alto, CA (US)

(73) Assignee: The Regents of the University of California, Oakland, CA (US)

( * ) Notice: Subject to any disclaimer, the term of this patent is extended or adjusted under 35 U.S.C. 154(b) by 475 days.

(21) Appl. No.: 12/936,586

(22) PCT Filed: Apr. 21, 2009

(86) PCT No.: PCT/US2009/041255
§ 371 (c)(1),
(2), (4) Date: Dec. 22, 2010

(87) PCT Pub. No.: WO2009/132004
PCT Pub. Date: Oct. 29, 2009

(65) Prior Publication Data
US 2011/0108815 A1    May 12, 2011

Related U.S. Application Data

(60) Provisional application No. 61/124,985, filed on Apr. 21, 2008, provisional application No. 61/125,293, filed on Apr. 24, 2008.

(51) Int. Cl.
*H01L 51/40* (2006.01)
(52) U.S. Cl.
USPC ............. 438/99; 257/40; 257/E51.001
(58) Field of Classification Search
USPC ................. 257/40, E51.001; 438/99
See application file for complete search history.

(56) References Cited

U.S. PATENT DOCUMENTS

| 5,240,878 A | 8/1993 | Fitzsimmons et al. |
| 6,156,665 A | 12/2000 | Hamm et al. |
| 2003/0047729 A1 | 3/2003 | Hirai et al. |

OTHER PUBLICATIONS

An, Lihua, et. al., "Nanometer metal line fabrication using a ZEP520/50 K PMMA bilayer resist by e-beam lithography". *J. Vac. Sci. Technol. B*, 23 (4) Jul./Aug. 2005, pp. 1603-1606.

(Continued)

*Primary Examiner* — Anthony Ho
(74) *Attorney, Agent, or Firm* — Greer, Burns & Crain Ltd.

(57) ABSTRACT

A method for forming a thin film electrode for an organic thin film transistor of the invention provides a multi-layer mask on a substrate with an electrode area opening in a top layer of the mask that is undercut by openings in other layers of the mask. A thin film of metal is deposited in the electrode area on the substrate. Removing the multi-layer mask leaves a well-formed thin film electrode with naturally tapered edges. A preferred embodiment of the invention is a method for forming a thin film electrode for an organic thin film transistor. The method includes depositing a first layer of photoresist on a substrate. The photoresist of the first layer has a first etching rate. A second layer of photoresist is deposited on the first layer of photoresist. The photoresist of the second layer has a second etching rate that is lower than the first etching rate. The first and second layer of photoresist are patterned by exposure. Developing the first and second layers of photoresist provides an electrode area on the substrate. An electrode is deposited in the electrode area. Lift-off of the first and second layers is performed. The electrode that is deposited has a tailored, tapered edge. A preferred embodiment thin film electrode in an organic thin film transistor has a tapered edge with a contact angle of approximately +40±4.4°.

22 Claims, 25 Drawing Sheets

(56) References Cited

OTHER PUBLICATIONS

Bao, Zhenan, et. al., "Organic field-effect transistors with high mobility based on copper phthalocyanine", *Appl. Phys. Letter*, 69 (20), Nov. 11, 1996, pp. 3066-3068.

Bohrer, Forest, I., et. al., "Gas sensing Mechanism in Chemiresistive Cobalt and Metal-Free Phtalocyanine Thin Films", *J. Am. Chem. Soc.*, 129, 2007, pp. 5640-5646.

Bouvet, Marcel, "Phthalocyanine-based field-effect transistors as gas sensors", *Anal Bioanal Chem*, 384, 2006, pp. 366-373.

Dimitrakopoulos, Christos D., et. al., "Organic Thin Film Transistors for Large Area Electronics", *Adv. Mater.*, vol. 14, No. 2, Jan. 116, 2002, pp. 99-117.

Ishii, Tetsuyoshi, et. al., "Nanocomposite resist system", *Appl. Phys. Lett.*, 70 (9), Mar. 3, 1997, pp. 1110-1112.

Miller, Casey W., et. al., "Quantitative structural analysis of organic thin films: An X-ray diffraction study", *Physical Review B*, vol. 72, Issue 10, (2005) pp. 104113-1-104113-6.

Miller, Karla A., et. al., "Electrode Independent Chemoresistive Response for Cobalt Phthalocyanine in the Space Charge Limited Conductivity Regime", *J. Phys. Chem. B*, 110, 2006, pp. 361-366.

Rooks, M.J., et. al., Split-gate electron waveguide fabrication using multilayer poly(methylmethacrylate), *J. Vac. Sci. Technol. B*, 9(6) Nov./Dec. 1991, pp. 2856-2860.

Schmechel, Roland, et. al., "Electronic traps in organic transport layers", *phys. stat. sol.* (a), 201, No. 6, 2004, pp. 1215-1235.

Someya, Takao, et. al., "Vapor sensing with $\alpha,\omega$-dihexylquarterthiophene filed-effect transistors: The role of grain boundaries", *Applied Physics Letters*, vol. 81, No. 16, Oct. 14, 2002 pp. 3079-3081.

Talin, A. A., et. al., "Extreme ultraviolet lithography based nanofabrication using a bilevel photoresist", *J. Vac. Sci. Technol. B*, 22(2) Mar./Apr. 2004, pp. 780-784.

Van Der Gaag, B. P., et. al., "Microfabrication below 10nm", *Appl. Phys. Lett.* 56 (5), Jan. 29, 1990, pp. 481-483.

Yang, Richard D., et. al., "Chemical identification using an impedance sensor based on dispersive charge transport", *Applied Physics Letters*, 88, 2006, 074104-1-074104-3.

Yang, Richard D., et. al., "Ultrathin organic transistors for chemical sensing", *Applied Physics Letters*, 90, 2007 pp. 263506-1-263506-3.

Yang, Richard D., et. al., "Ultralow drift in organic thin-film transistor chemical sensors by pulsed gating", *Journal of Applied Physics*, 102, 2007, pp. 034515-1-034515-7.

Zhu, Zheng-Tao, et. al., "Humidity sensors based on pentacene thin-film transistors", *Applied Physics Letters*, vol. 81, No. 24, Dec. 9, 2002, pp. 4643-4645.

Zilker, S. J., et. al. "Bias stress in organic thin-film transistors and logic gates", *Applied Physics Letters*, vol. 79, No. 8, Aug. 20, 2001, pp. 1124-1126.

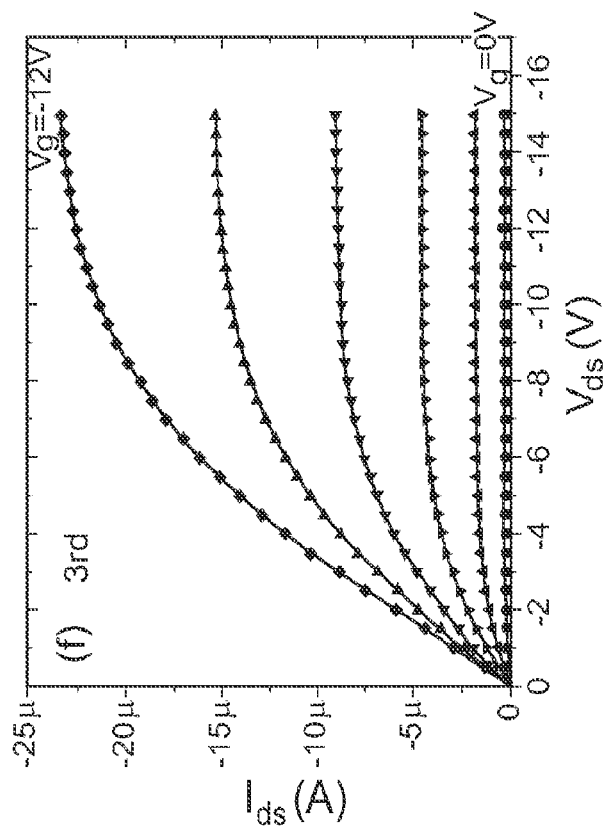
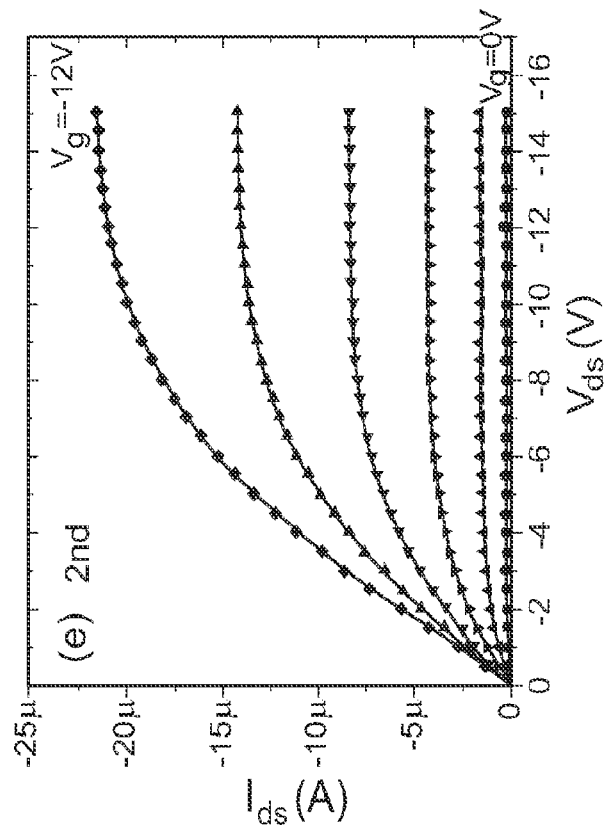
FIG. 8F
FIG. 8E

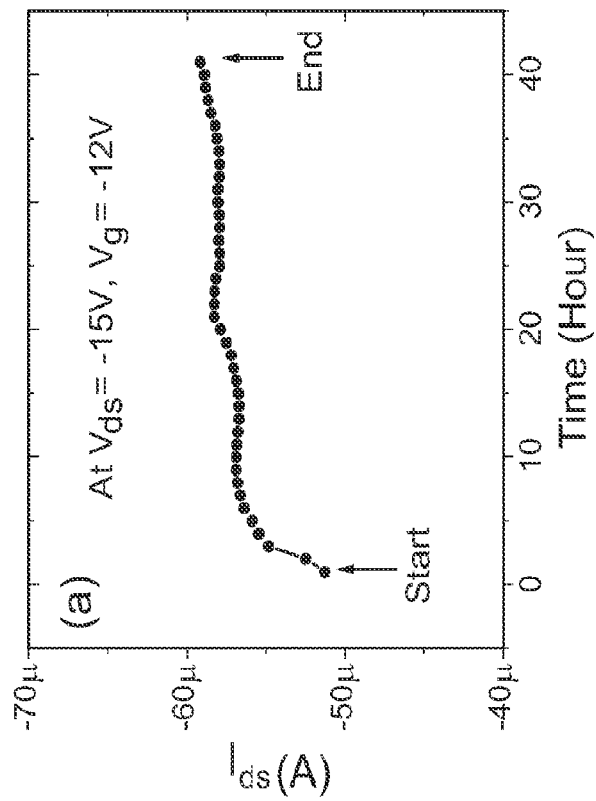
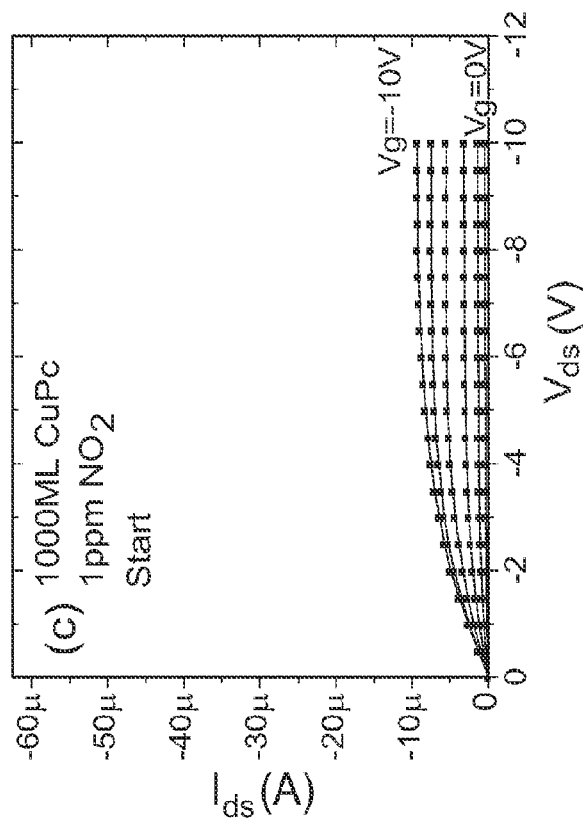
FIG. 11D
FIG. 11C

MULTI-RATE RESIST METHOD TO FORM ORGANIC TFT CONTACT AND CONTACTS FORMED BY SAME

PRIORITY CLAIM AND REFERENCE TO RELATED APPLICATIONS

This application claims priority under 35 U.S.C. §119 and all other applicable statutes and treaties from prior U.S. provisional application Ser. No. 61/124,985 filed on Apr. 21, 2008 and from prior U.S. provisional application Ser. No. 61/125,293 filed on Apr. 24, 2008. This application also claims priority under 35 U.S.C. §120 and all other applicable statutes and treaties and is a continuation in part of prior PCT application number PCT/US2008/005743 (published as WO 2008/147497), having an international filing date of May 5, 2008.

STATEMENT OF GOVERNMENT INTEREST

This invention was made with government support under contract number F49620-02-1-0288 awarded by the Air Force Office of Scientific Research and contract number 0350571 awarded by the National Science Foundation. The government has certain rights in the invention.

FIELD

A field of the invention is organic thin film transistors and the fabrication of organic thin film transistors. Another field of the invention is chemical sensing. A chemical sensor of the application has example applications including, for example, as a back-end detector for handheld gas chromatography; as a household or industrial sensor for detecting gas leakages; as an explosive vapor detector, and as a chemical warfare agent detector.

BACKGROUND ART

Organic thin-film transistors are formed as thin films of an organic semiconductor, dielectric and electrodes on a substrate. A wide variety of substrates can be used, including traditional semiconductor substrates and other substrates such as glass, polymers, etc. Depending on the substrate selected and the materials used for electrodes, organic thin film transistors can be completely transparent when transparent semiconductors and electrodes are used. Transparency is advantageous, for example, in display applications. Organic thin film transistors have a wide range of applications, e.g., displays, optoelectronics, logic circuits, and sensors. Carrier mobility and other performance characteristics of organic semiconductor devices are presently low compared to single-crystal inorganic semiconductors, however organic thin film transistors offer considerable advantages in lower processing temperature, larger area fabrication, and lower cost manufacturing.

Some materials used in organic thin film transistors have other advantages over inorganic single-crystal semiconductors. Semiconducting CuPc thin-films, for example, have high chemical stability and exhibit substantial responses to chemical analytes as chemiresistors. Ultrathin organic thin film transistors are of interest for studying intrinsic electrical properties of organic materials and also for their potential to have reduced bias stress compared to standard organic thin film transistors and enhanced sensitivity in chemical field-effect transistors (ChemFETs). ChemFETs are organic thin film transistors whose output characteristics are sensitive to the presence of analytes via changes in the channel mobility and/or threshold voltage induced by analyte chemisorption onto the channel materials.

Chemical sensing is a critical process in a large number of everyday household, industrial, military, and scientific processes. A chemical sensor that can indicate the presence of a chemical of interest is useful to provide warnings, such as to indicate an unacceptable level of carbon monoxide or to provide a warning regarding the presence of an explosive vapor or a chemical warfare agent or vapors from secondary sources such as household molds. Similarly, chemical sensors can provide information on the presence or absence of a particular chemical in a process control scheme. The presence or absence of a gas can provide feedback used to control a wide range of industrial processes. In the area of scientific research, many instruments including, for example, chromatography instruments benefit from sensitive chemical detectors.

Sensitivity is a critical aspect of chemical sensors. More sensitive sensors can detect lower levels of chemical agent. Accordingly, there is great interest in producing highly sensitive chemical sensors. Early warning regarding levels of sensed chemicals, faster control of processes responsive to particular levels of sensed chemicals, and better detection in difficult environments are achieved as sensitivity increases. Some particular example applications of interest in the art will now be discussed.

One application of interest is the detection of ultra-trace amounts of explosives and explosive-related analytes. Such detection is of critical importance in detecting explosives in a number of civilian and military or security applications, e.g., mine fields, military bases, remediation sites, and urban transportation areas. Low-cost and portability have clear additional advantages to such sensor applications.

In security applications, chemical sensors are preferable to other detection devices, such as metal detectors, because metal detectors frequently fail to detect explosives, such as those in the case of the plastic casing of modern land mines. Similarly, trained dogs can be both expensive and difficult to maintain in many desired applications. Other detection methods, such as gas chromatography coupled with a mass spectrometer, surface-enhanced Raman Spectroscopy, nuclear quadrupole resonance, energy-dispersive X-ray diffraction, neutron activation analysis and electron capture detection are highly selective, but are expensive and not easily adapted to a small, low-power package for broad distribution.

A particular type of chemical sensor that has been investigated is an organic thin film transistor that has its conduction channel affected in the presence of a chemical analyte. The general principal has been demonstrated, while typical efforts have not demonstrated a useful level of sensitivity. Example transistor chemical sensors are disclosed in the following articles. Torsi, et al., Sens. Actuators, B 67, 312 (2000). The channel material in Torsi et al was 1,4,5,8-naphthalene tetracarboxyl dianhydride. Channel thickness in the chemical sensor was 500 Å (>50 MLs); Crone, et al., Appl. Phys. Lett. 78, 2229 (2001) discloses a sensor with channel materials: of di-dodecyl a-6T. The thickness was 100-1000 Å (10-100 MLs). Someya, et al, Appl. Phys. Lett. 81, 3079 (2002) discloses channel materials: of DHa4T with thickness: 150 Å (15 MLs). Zhu, et al, Appl. Phys. Lett. 81, 4643 (2002), discloses channel materials of pentacene. The thickness was 500 Å (50 MLs).

Studies of the charge transport process in organic thin film transistors have shown that carriers conduct primarily through the first 1-5 MLs above the gate dielectric. G. Horowitz, J. Mater. Res. 19, 1946 (2004). Many prior organic thin film transistor sensors have not recognized or taken advantage of the charge carrier mechanism, having channel layers that are 10 monolayers or more, and typically 50 monolayers or more. Despite intensive study of organic thin film transistors in chemical sensing, the transduction mechanism is not fully understood.

Another issue that impacts and limits usefulness of organic thin film transistor sensors is baseline drift. With static gate bias operation, even encapsulated organic thin film transistors exhibit a large bias stress effect (BSE). This bias instability has been observed on organic thin film transistors fabricated with a wide range of active materials and is associated with charge trapping in the organic film. Substantially delaying the time between measurements by hundreds of seconds reduces the BSE, but such a time delay is too long for many chemical sensing measurements. Baseline voltage compensation has also been considered, but simple baseline voltage compensation methods fail to reduce BSE.

As mentioned above, the conduction channels in organic thin film transistors have carriers conducting primarily through a few monolayers (MLs) above the gate dielectric. Due to this conduction mechanism, the contact between the electrode and the organic thin film layer and substrate significantly affects the carrier transport behavior of organic films. Conventional thin film electrode fabrication techniques can produce contact resistances that are high and that produce a large number of inoperable or low performance devices as a percentage of devices that are being fabricated Another issue of concern in the manufacture and uses of organic thin film transistors is the long term stability and device integrity in ambient operating conditions. Oxygen and humidity are known to produce instability in organic thin film transistors, which can have performance that suffers from degradation or aging.

SUMMARY OF THE INVENTION

A method for forming a thin film electrode for an organic thin film transistor of the invention provides a multi-layer mask on a substrate with an electrode area opening in a top layer of the mask that is undercut by openings in other layers of the mask. A thin film of metal is deposited in the electrode area on the substrate. Removing the multi-layer mask leaves a well-formed thin film electrode with naturally tapered edges.

A preferred embodiment of the invention is a method for forming a thin film electrode for an organic thin film transistor. The method includes depositing a first layer of photoresist on a substrate. The photoresist of the first layer has a first etching rate. A second layer of photoresist is deposited on the first layer of photoresist. The two layers of photoresist form a multi-layer mask. The photoresist of the second layer has a second etching rate that is lower than the first etching rate. The first and second layer of photoresist are patterned by exposure. Developing the first and second layers of photoresist provides an electrode area on the substrate. An electrode is deposited in the electrode area. Lift-off of the first and second layers is performed. The electrode that is deposited has a tailored, tapered edge. A preferred embodiment thin film electrode in an organic thin film transistor has a tapered edge with a contact angle of approximately +40±4.4°.

BRIEF DESCRIPTION OF THE DRAWINGS

FIGS. 8A-8F illustrate data from environmental cycle regeneration testing;

FIGS. 11A-11D shows the results of test that confirm that oxidents in air are responsible for aging of organic thin film transistors.

DETAILED DESCRIPTION OF THE PREFERRED EMBODIMENTS

Figure 1:
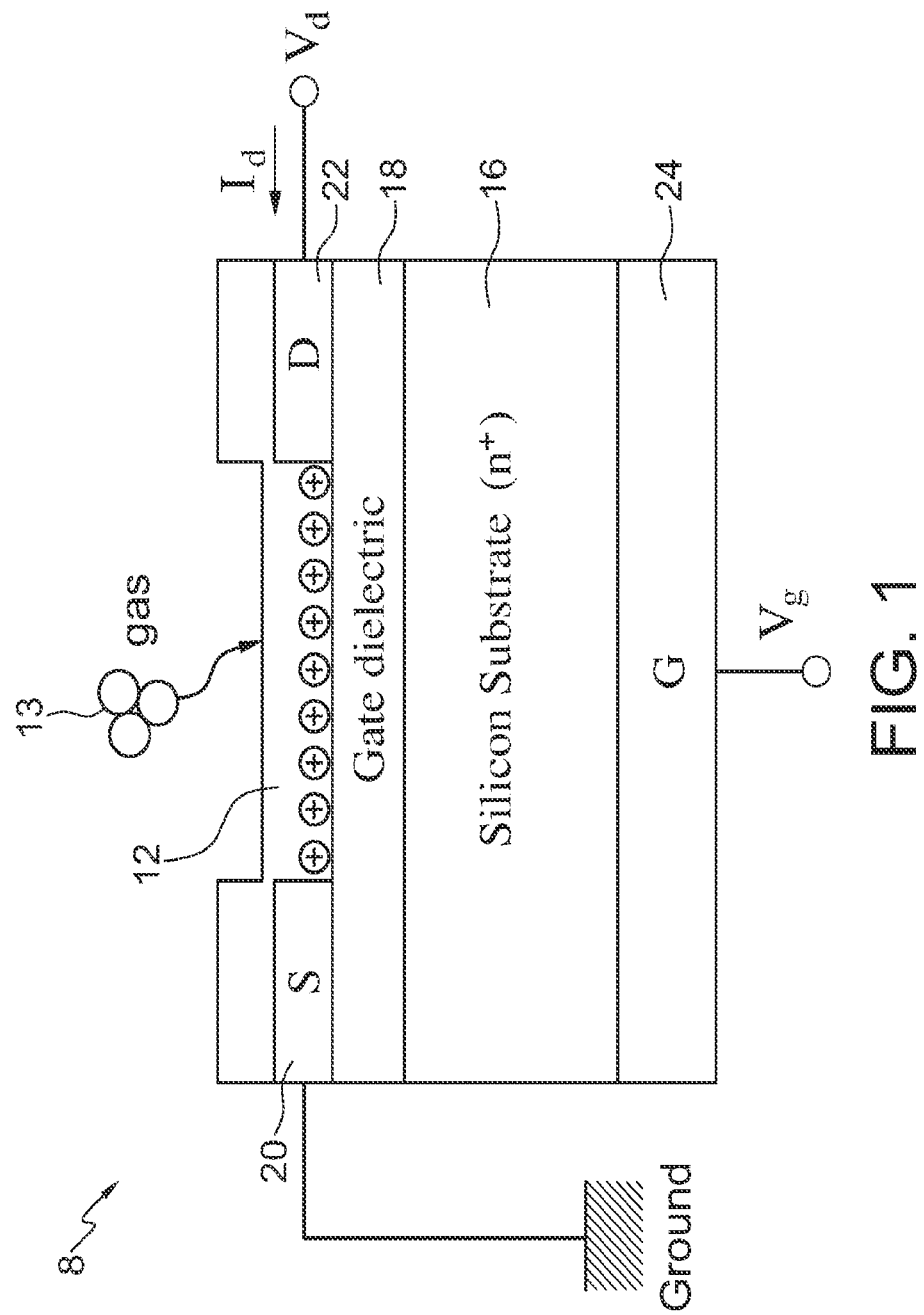
FIG. 1 is a schematic diagram that illustrates a preferred embodiment organic ultra-thin transistor chemical sensor of the invention.

A method for forming a thin film electrode for an organic thin film transistor of the invention provides a multi-layer mask on a substrate with an electrode area opening in a top layer of the mask that is undercut by openings in other layers of the mask. A thin film of metal is deposited in the electrode area on the substrate. Removing the multi-layer mask leaves a well-formed thin film electrode with naturally tapered edges.

A preferred embodiment of the invention is a method for forming a thin film electrode for an organic thin film transistor. The method includes depositing a first layer of photoresist on a substrate. The photoresist of the first layer has a first etching rate. A second layer of photoresist is deposited on the first layer of photoresist. The photoresist of the second layer has a second etching rate that is lower than the first etching rate. The first and second layer of photoresist are patterned by exposure. Developing the first and second layers of photoresist provides an electrode area on the substrate. An electrode is deposited in the electrode area. Lift-off of the first and second layers is performed. The electrode that is deposited has a tailored, tapered edge. A preferred embodiment thin film electrode in an organic thin film transistor has a tapered edge with a contact angle of approximately +40±4.4°.

The morphology of thin film electrode edges is well-controlled by fabrication methods of the invention and excellent contact angles are obtained. Preferred fabrication methods of the invention have been tested and demonstrated to produce thin film electrodes with lower contact resistances, increased field effect mobilities, and decreased threshold voltages. Additionally, the defect percentage (number of devices that fail on/off testing) is reduced considerably compared to conventional thin film electrode fabrication techniques. Embodiments of the invention are applicable to organic thin film transistor fabrication generally, and produce electrodes with a tapered edge morphology.

Preferred methods and devices of the invention use an ultrathin film organic channel (approximately 4 to 12 monolayers). A variety of organic materials are suitable. Preferred materials include copper phthalocyanine (CuPc), $CuC_{32}N_8H_{16}$, cobalt phthalocyanine (CoPc), $CoC_{32}N_8H_{16}$, metal-free phthalocyanine ($H_2Pc$), $C_{32}N_8H_{18}$, Copper-Hexadecafluorophthalocyanine ($F_{16}CuPc$)($F_{16}CuC_{32}N_8H_{16}$). Preferred methods for deposition and sensing with ultrathin organic films are disclosed in PCT Publication No. WO 2008/147497. Sensors are also disclosed in Kummel et al., "Gas Sensing Mechanism in Chemiresistive Cobalt and Metal-free phthalocyanine thin films." J Am Chem Soc 17 (5640-6) (2007); Kummel et al, "Ultrathinorganic Transistors for Chemical Sensing," Appl. Phys. Lett, 90, 263506/1-3 (2007). The materials and thin film depositions described in those publications can be used in preferred embodiments of the present invention to produce an ultrathin film organic transistor of the invention with high quality tapered thin film electrodes.

Fabrication methods and ultrathin organic thin film transistors organic thin film transistors of the invention provide low contact resistances between an organic ultrathin film channel and thin film source and drain electrodes. Contact resistance between the organic material and electrodes is a critical problem in ultrathin organic thin film transistors, typically having an ultrathin organic channel layer deposited on interdigitated source and drain thin film electrodes. Careful tapering of the electrodes is provided by the invention to ensure excellent contact with the organic thin film channel.

The invention also provides a method for regeneration of organic thin film transistors. Preferably, the method is applied to preferred embodiment ultrathin organic thin film transistors, but regeneration methods of the invention are also applicable to organic thin film transistors having conventional thin film channels up to 1000s of monolayers. Organic thin film transistors are regenerated by long exposure to clean water vapor. Regeneration is also applicable, for example, to nearly any polycrystalline organic films. This will benefit the manufacture of organic light emitting diodes and organic voltaic chips, for example. A particular application of the regeneration technique is for the manufacture of organic light emitting diode (OLED) displays. By performing regeneration immediately prior to sealing of the OLED display, the transistor performance can be improved. This can permit large scaling as the process of manufacture needn't be sped up to avoid the aging of the transistors that are exposed to oxidants.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIG. 1 shows an example embodiment organic thin-film transistor 8 that can be used, for example, as a chemical sensor. The transistor 8 includes an organic thin film channel 12 that is preferably ultrathin (one or small number (4'-12)) atomic or molecular monolayers. Making the channel ultrathin provides extreme sensitivity to analyte, such as a gas analyte 13. Thin films, e.g., up to about 1000 monolayers are used in other embodiments. The example embodiment transistor 8 is formed on a silicon substrate 16. While the example embodiment is a silicon based device, other material systems can also be used, and substrates such as plastics, glass, etc. are possible. Gate dielectric 18, e.g., silicon dioxide, isolates thin film source 20 and drain 22 electrodes, and a gate electrode 24 is formed on an opposite side of the substrate 16. The thin film source 20 and drain 22 electrodes have tapered edges (illustrated in FIGS. 2A-2F). Many transistor devices can be formed, and preferred sensors of the invention have a plurality of transistors 8 with the electrodes from different devices being patterned as interdigitated fingers. There is a common gate but each device has separate sources and drains formed, for example, as interdigitated fingers.

The thin film channel 12 in the organic thin-film transistor 8 is formed by an organic thin film, which serves as the charge transport layer. A variety of organic materials are suitable. Preferred materials include copper phthalocyanine (CuPc), $CuC_{32}N_8H_{16}$, cobalt phthalocyanine (CoPc), $CoC_{32}N_8H_{16}$, metal-free phthalocyanine ($H_2Pc$), $C_{32}N_8H_{18}$, Copper-Hexadecafluorophthalocyanine ($F_{16}CuPc$)($F_{16}CuC_{32}N_8H_{16}$).

At appropriate gate (Vg) and drain (Vd) voltages, a conduction channel forms above the gate dielectric 18. The adsorption of analyte, e.g., the analyte gas 14, on the surface of the thin-film 12 modulates the channel conductance. This produces a chemical signal response that can be electrically read, either by DC or AC measurements.

When conventional methods are used to produce thin film and ultra thin film electrodes for the device 8, high contact resistance and other poor properties can result due to poor electrode formation. FIGS. 2A-2D illustrate a conventional process for forming an electrode as the starting point for a bottom electrode CuPc organic thin film transistor. Photoresist 10 is deposited and patterned on a substrate 12, such as silicon substrate with a silicon dioxide layer. Metallization is conducted to deposit metal 14 in the pattern defined by the resist 10, which is also overcoated with metal 14. Removal of the resist results in an electrode 16 have a high contact angle at its edge with separation from the substrate. The SEM image in FIG. 2D reveals the high contact angle.

Figure 3A:
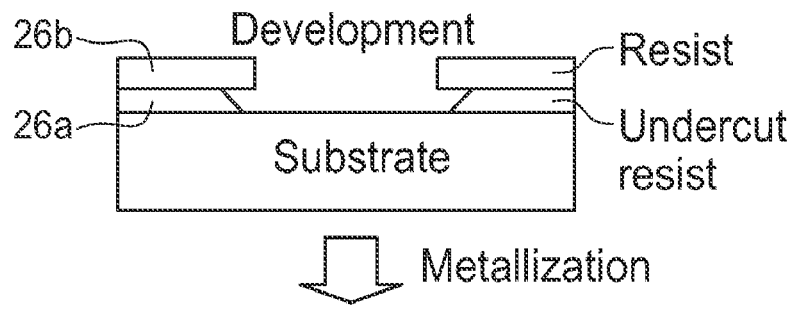
FIGS. 3A-3F illustrate a method for forming a preferred embodiment thin film electrode in a bottom electrode organic thin film transistor device of the invention.
Figure 3B:
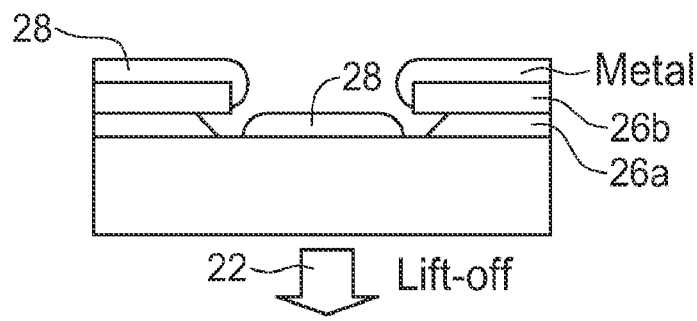
Figure 3C:
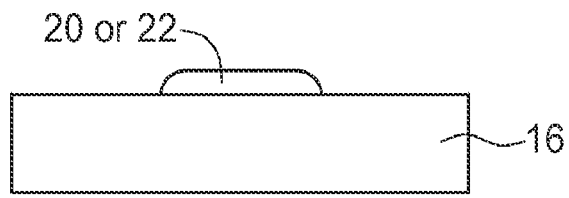
Figure 3D:
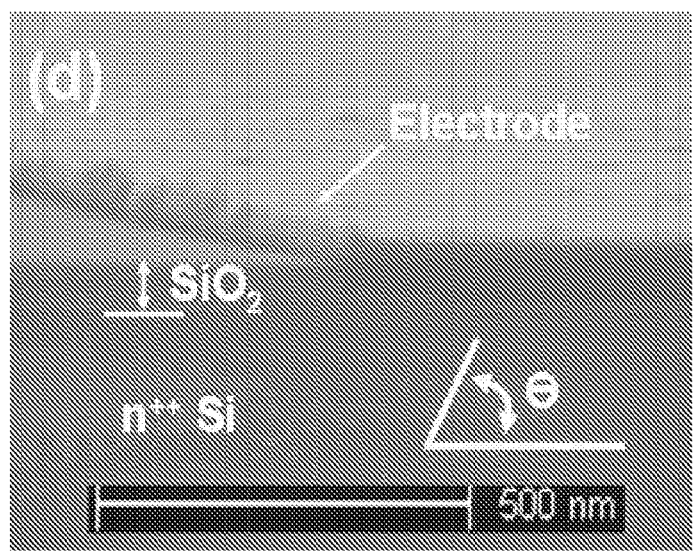

FIGS. 3A-3D illustrate a process of the invention for forming an electrode as the starting point for a bottom electrode CuPc organic thin film transistor of the invention. FIG. 3A illustrates the result of depositing two separate layers of photoresist 26a and 26b, where the first layer 26a of photoresist on the substrate 16 has a first etching rate. The second photoresist layer 26b has an etching rate that is lower than the etching rate of the first layer 10a of photoresist. Exposure defines a pattern in the first and second layer of photoresist, and the development of the first and second layers of photoresist 26a and 26b removes photoresist according to the pattern in the layer 26b, and results in an undercut in the layer 26a, where the second layer 26b overlaps the first layer as a result of the different etching rates, as illustrated in FIG. 3A. This creates a multi-layer mask having an opening that is undercut. The thin film metal 20 (to form source and/or drain electrodes 20 or 22) then deposits without contacting the first layer 26a of photoresist and providing a natural taper near the edges of the formed electrode 20 or 22, which is deposited in a electrode area defined by the opening in the second layer 26b. The bi-layer lift-off of the first 26a and second layers 26b leaves the electrode 20 or 22 with tapered edges. In a preferred embodiment, the thin film electrode 20 or 22 has a tapered edge and a contact angle of approximately +40±4.4°.

Figure 2A:
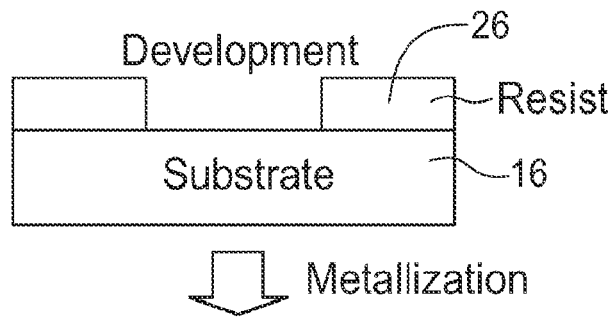
FIGS. 2A-2F illustrate a conventional process for forming a thin film is electrode in a bottom electrode organic ultrathin film transistor.
Figure 2B:
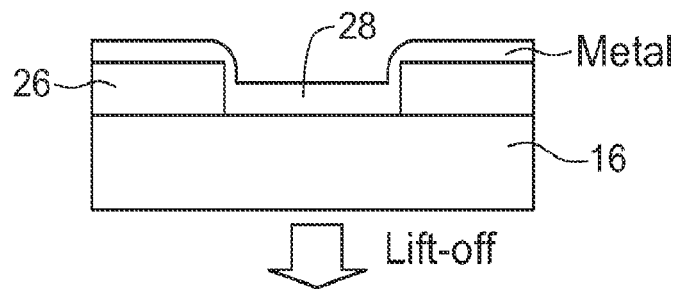
Figure 2C:
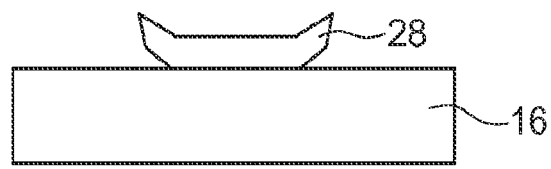
Figure 2D:
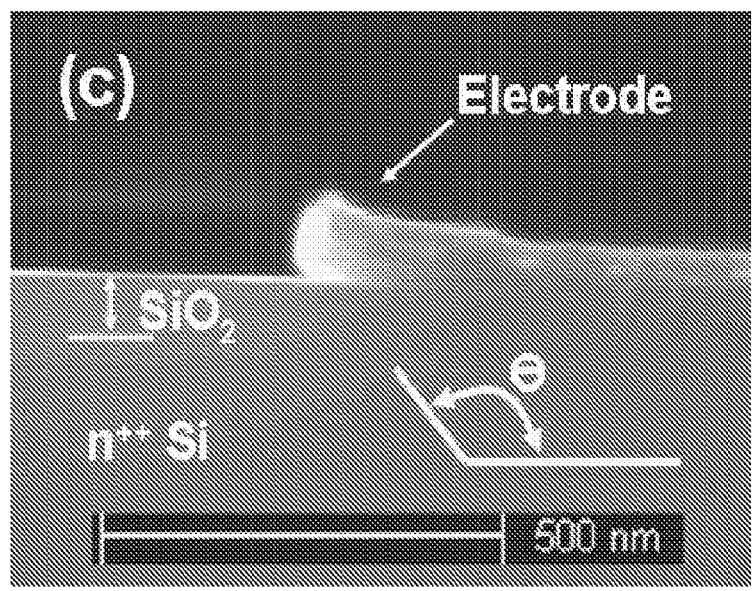
Figure 2E:
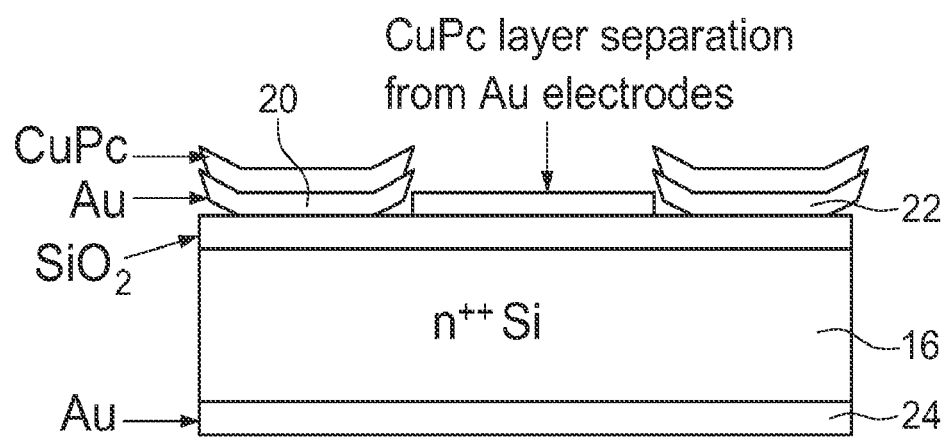
Figure 2F:
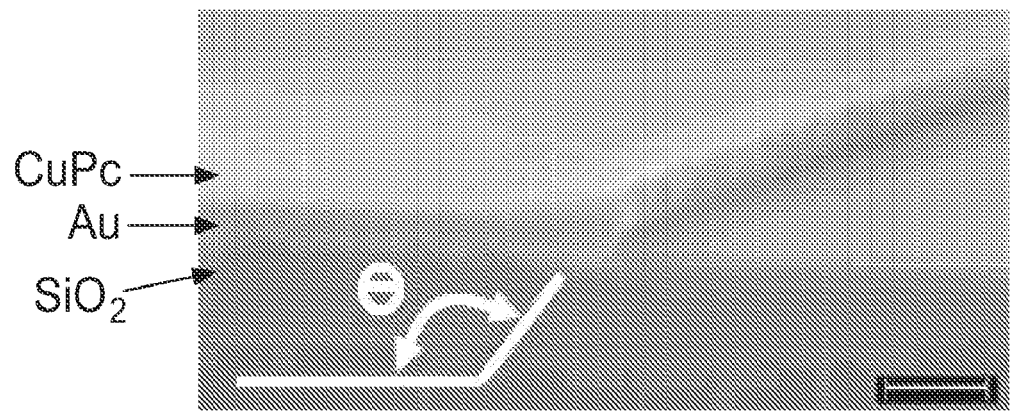
Figure 3E:
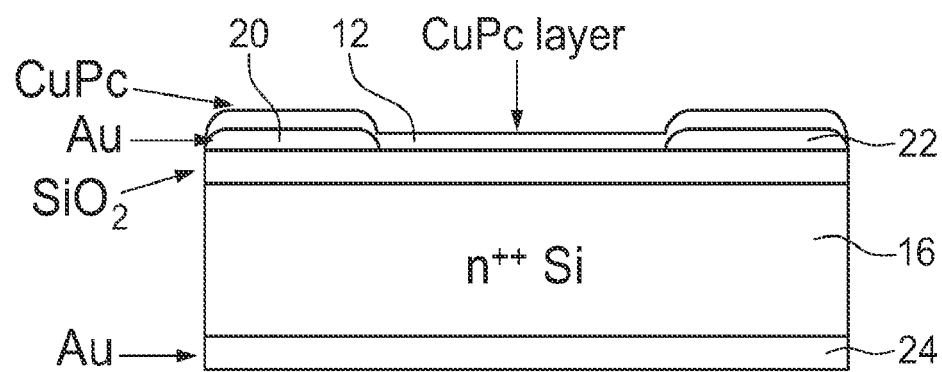
Figure 3F:
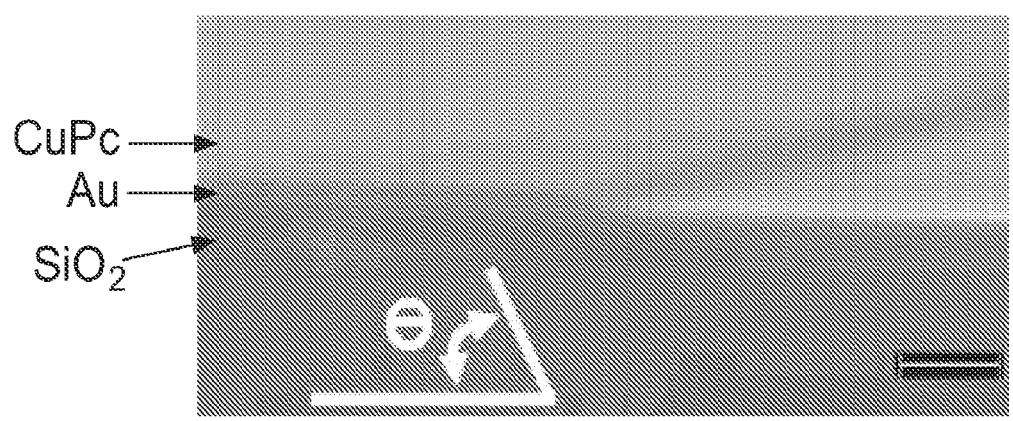

FIGS. 3E and 3F illustrate the completion of a thin film organic thin film transistor device of the invention by deposition of an thin film channel 12 of an organic thin film semiconductor such as CuPc, e.g., in the approximate range of 4-12 monolayers. The channel 12 is formed upon the thin dielectric layer of $SiO_2$ 18 on the heavily doped silicon substrate 16 that includes the bottom electrode 24 (such as gold). Tapered thin film source and drain electrodes 20 and 22 are covered by the ultrathin film channel 12. Compared to a conventional formation process shown completed in FIGS. 2E and 2F, there is no separation of the organic film from the electrodes, as revealed in the SEM images.

Ultrathin Organic Thin Film Transistor Experimental Formation and Devices

To test the electrode performance for the formation method and organic thin film transistor device of FIGS. 3A-3F experimental devices were formed and tested. More than 100 p-channel organic thin film transistors were fabricated with ultrathin (12 MLs) copper phthalocyanine (CuPc) channels using the FIGS. 3A-3F formation method of the invention. The method and devices were compared to devices formed by the method illustrated in FIGS. 2A-2F. Devices of the invention had two orders of magnitude improved field effect mobility, three orders of magnitude decreased contact resistance, and order of magnitude increased on/off ratio, and a factor of three decrease in threshold voltage compared to devices formed by the method of FIGS. 2A-2F.

The conventional devices and devices of the invention were formed on thermally grown $SiO_2$ (100 nm thickness) on (100) $n^+$ Si substrates. The heavily doped Si substrate and the $SiO_2$ served as a common gate and gate dielectric, respectively. The channel length was defined by photolithography to be 5 microns. After cleaning the $SiO_2$ layer on the n+ Si substrate, the photoresist layers were deposited by spin coating.

The two different etching rate photoresist materials to perform the inventive fabrication in FIGS. 3A-3F were polymethylglutarimide (PMGI) as first (faster) layer and Microposit® S1805 photoresist as the top (slower) resist layer. The first PMGI resist layer develops nearly isotropically and etches faster in Microposit® MF319 developer solution (Shiplay Corp.) than the second layer S1805. The amount of undercut is precisely controlled by the etching rate of the first PMGI. Source and drain electrodes were deposited with the use of electron beam evaporation at a rate of 1 Å/second. A 5 nm thick Ti adhesion layer was applied first, followed by deposition of 45 nm thick Au for a total electrode thickness of 50 nm. 18 chips each containing six devices were fabricated according to the inventive fabrication process in FIGS. 3A-3F. For the conventional fabrication process, 13 chips each containing six devices were fabricated.

The contact angles between the electrodes and the $SiO_2$ were measured for 10 electrodes of each type. The measured contact angles for the conventional process were +133.2±13.8°. The measured contact angles for the inventive process were +51.2±7.8°. The difference in contact angles is illustrated in the SEM images of FIGS. 2F and 3F. The SEM data show that the conventional electrode fabrication process produces an electrode with elevated edges while the fabrication process of the invention produces a tapered electrode having its edges in contact with the substrate surface. In the test devices, the ultrathin semiconductor films were 12 MLs (16 nm) of CuPc, and were deposited by organic molecular beam epitaxy (OMBE) in a UHV chamber with a base pressure of $2\times10^{-10}$ torr. The substrate temperature was kept at 25° C. during deposition.

A total of 10 electrodes, each on a different device, were examined by SEM and 100% had nearly identical structures to those displayed in FIGS. 2F and 3F. The contact angles between the electrodes and the $SiO_2$ after CuPc deposition were +136±10.1° and +40±4.4° for the conventional process and for the inventive process, respectively. Devices produced by the conventional electrode fabrication process of FIGS. 2A-2F have electrodes that are physically detached from the organic channel and from the substrate. Conversely, the devices produced by the process of the invention of FIGS. 3A-3F have a smooth contact between the source/drain metal electrodes and the organic channel as well as between the electrodes and the dielectric layer of the substrate.

Figure 4B:
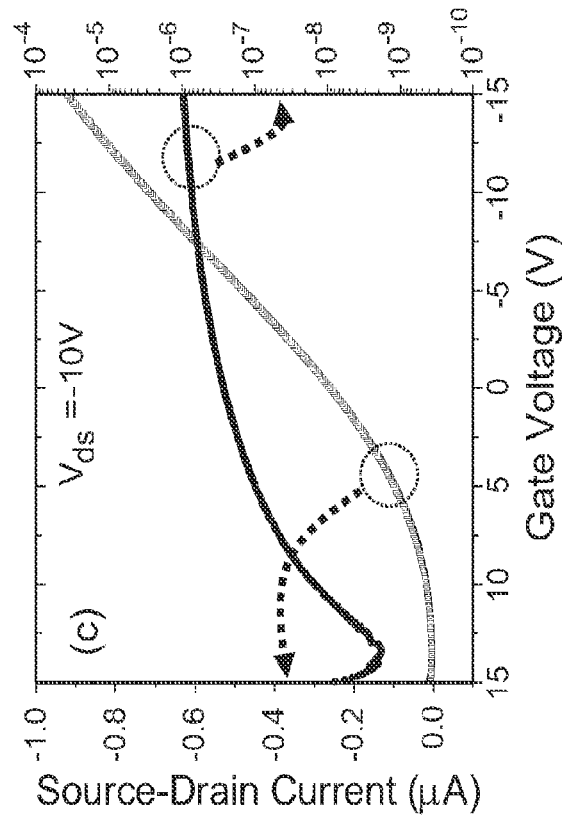
FIGS. 4B (prior art devices) and 5B (devices of the invention) are the typical transfer curves of organic thin film transistors at a fixed $V_{ds}$ of −10 V.
Figure 4A:
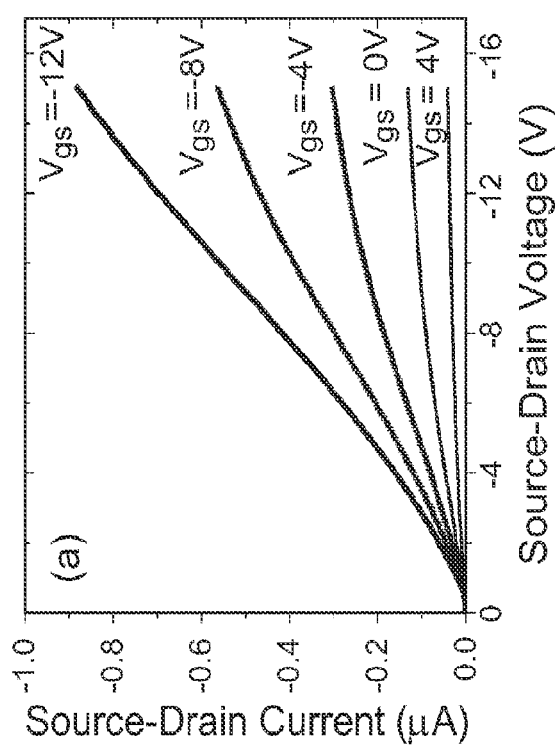
FIGS. 4A (prior art devices) and 5A (devices of the invention) are representative plots of source-drain current ($I_{ds}$) versus source-drain voltage ($V_{ds}$) at different gate-source voltages ($V_{gs}$) from +8 to −12 V.
Figure 5B:
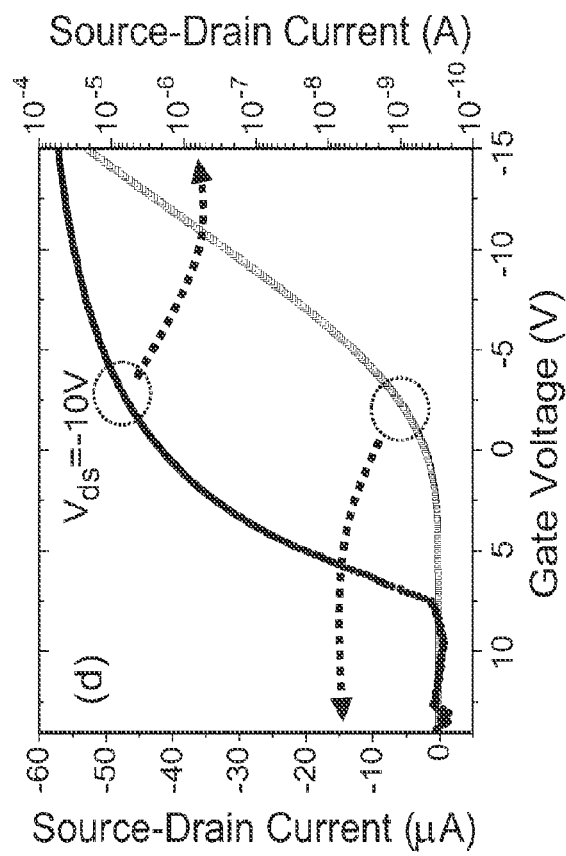
Figure 5A:
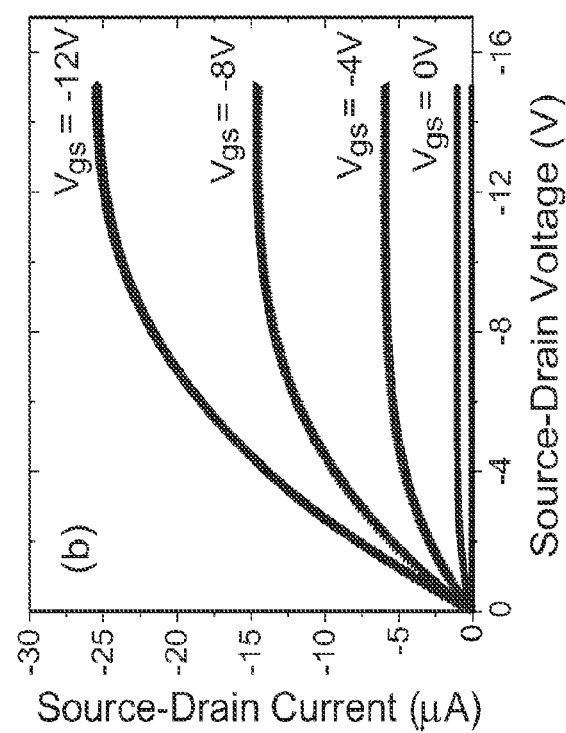

DC electrical properties of test devices were determined from I-V measurements with a HP 4155A semiconductor parameter analyzer. The organic thin film transistor devices were characterized in an optically isolated probe station at 25° C. to minimize photocurrent. FIGS. 4A (prior art devices) and 5A (devices of the invention) are representative plots of source-drain current ($I_{ds}$) versus source-drain voltage ($V_{ds}$) at different gate-source voltages ($V_{gs}$) from +8 to −12V. The output characteristics of the conventional organic thin film transistors show a p-type behavior with a lack of current saturation. The devices of the invention have significantly increased on-state current, from $0.7\times10^{-6}$ to $2.6\times10^{-5}$ amperes, under the same $V_{ds}$ (−15 V) and $V_{gs}$ (−12 V) conditions, as seen in FIG. 5A. FIG. 5A also has a clearly defined linear region and saturation region. FIG. 5B (prior art devices) and 5B (devices of the invention) are the typical transfer curves of organic thin film transistors at a fixed $V_{ds}$ of −10 V. All the devices were p-channel transistors, and all the devices produced by the process of the invention had good ohmic behavior at low voltages as demonstrated by the intercept at the origin and the saturated current at high $V_{ds}$. Transfer curves from the inventive bi-layer lift-off devices are consistent with a well behaved organic thin film transistor, while the transfer curves from the conventional devices are consistent with an organic thin film transistor having a poor on-off ratio and poor subthreshold performance.

The electrical parameters of 79 ultrathin film organic thin film transistors produced by the process of the invention and 41 ultrathin film organic thin film transistors produced by the conventional process are summarized in Table 1. 91% of the devices produced by the process of the invention had measurable electronic properties. The failures of 9% of the devices were mostly due to gate leakage. A much smaller rate of failure is expected in commercial fabrication process, which offer better clean room procedures than in the experiments. Measurable electrical properties were only obtained from 41 organic thin film transistors out of 78 (53%) for devices fabricated using the conventional process of FIGS. 2A-2F, primarily due to poor reliability of the electrodes.

The mobilities in Table 1 were extracted from the linear region, and on/off ratio obtained from the drain current for $V_{gs}$=15 V to $V_{gs}$−15 V. The on-state current was calculated from the drain current at fixed $V_{gs}$=−15 V and Vd=−10 V). "SD" is the standard deviation while "SE" is the standard error. SD can exceed the mean values since the distributions are highly asymmetric for the devices produced by the method of FIGS. 1A-1F.

TABLE 1

| | FIG. 2A-2F Process | | | | | FIG. 1A-1F Process | | | | |
|---|---|---|---|---|---|---|---|---|---|---|
| | Mean | sd | sd (%) | se | se (%) | Mean | sd | sd (%) | se | se (%) |
| $V_{th}$ (V) | 2.23 | 1.09 | 49 | 0.12 | 5 | 5.71 | 4.70 | 82 | 0.73 | 12 |
| μ (cm$^2$/V · s) | $6.08\times10^{-4}$ | $1.27\times10^{-4}$ | 21 | $1.43\times10^{-5}$ | 2 | $3.45\times10^{-6}$ | $4.91\times10^{-6}$ | 142 | $7.67\times10^{-7}$ | 22 |

TABLE 1-continued

|  | FIG. 2A-2F Process | | | | | FIG. 1A-1F Process | | | | |
| --- | --- | --- | --- | --- | --- | --- | --- | --- | --- | --- |
|  | Mean | sd | sd (%) | se | se (%) | Mean | sd | sd (%) | se | se (%) |
| $R_c$ ($\Omega$) | $9.61 \times 10^4$ | $3.90 \times 10^4$ | 41 | $4.39 \times 10^3$ | 5 | $1.84 \times 10^8$ | $2.14 \times 10^8$ | 116 | $3.38 \times 10^7$ | 18 |
| $I_{ON}$ (A) | $4.13 \times 10^{-5}$ | $7.37 \times 10^{-6}$ | 18 | $8.30 \times 10^{-7}$ | 2 | $4.46 \times 10^{-7}$ | $7.02 \times 10^{-7}$ | 157 | $1.1 \times 10^{-7}$ | 24 |
| $I_{ON}/I_{OFF}$ ratio | $4.5 \times 10^4$ | $6.0 \times 10^4$ | 132 | $6.7 \times 10^3$ | 15 | $6.0 \times 10^3$ | $9.4 \times 10^3$ | 157 | $1.5 \times 10^3$ | 25 |

The field effect mobilities were extracted from the linear region ($V_{ds} \ll (V_{gs} - V_{th})$) of the $I_{ds}$ vs $V_{ds}$ plots for each device based on Eq. (1)

$$I_{ds} = \frac{nW}{L} \mu C_i \left( V_{gs} - V_{th} - \frac{V_{ds}}{2} \right) V_{ds}. \quad (1)$$

Here n is the number of fingers in the interdigitated electrode pattern, W is the channel width, L is the channel length, $C_i$ is the capacitance per unit area of the insulating layer, $V_{th}$ is the threshold voltage, and $\mu$ is the field effect mobility.

The field effect mobility values (mean+/−standard deviation) extrapolated from the linear region are $3.4 \pm 4.9 \times 10^{-6}$ cm$^2$/Vs (conventional) and $6.1 \pm 1.3 \times 10^{-4}$ cm$^2$/Vs (invention). The large difference in extrapolated field effect mobility values is consistent with a non-negligible parasitic resistance associated with the channel electrodes. There was also a one order of magnitude difference in on/off ratio between the conventional processed and the invention processed devices ($6.0 \times 10^3$ to $4.5 \times 10^4$). This increase in mobility and on/off ratio is consistent with a lower contact resistance in the devices produced by the process of the invention. In the linear region ($V_{ds} \ll (V_{gs} - V_{th})$), the overall device resistance $R_{on}$ at constant gate voltage can be written as the sum of the intrinsic channel resistance $R_{ch}$ and a contact resistance $R_c$ according to Eq. (2), where $\mu_i$ is the intrinsic mobility.

$$R_{on} = \left. \frac{\partial V_{ds}}{\partial I_{ds}} \right|_{V_{gs}=const.} = R_{ch} + R_c = \frac{L}{nWC_i\mu_i(V_{gs} - V_{th})} + R_c, \quad (2)$$

The contact resistance can be extracted by determining $R_{on}$ from the linear region of the output characteristics. The contact resistance values calculated from the linear region at fixed gate voltage ($V_{gs} = -12V$) are $1.84 \pm 2.14 \times 10^8$ ohm (conventional) and $9.61 \pm 3.90 \times 10^4$ ohm (invention). The dramatic improvement in device performance was not only the result of reduced contact resistance, but also the result of improved threshold voltages. The threshold voltages were extracted in the linear region by linearly extrapolating the transfer curves between $V_{gs} = -5$ to $-15$ V. The threshold voltages are $+5.7 \pm 4.7$ V (conventional) and $+2.2 \pm 1.1$ V (invention).

As shown in Table 1, the analysis of the standard deviations of the electrical parameters show that the fractional standard deviation of the mobility and on-current, are lower for the devices produced by the process of the invention compared to the devices produced by the convention process, which is consistent with the former process being more uniform. In organic thin film transistors, because the charge carriers are transported in a few monolayers adjacent to the gate oxide, small changes in the electrode profile can produce large changes in the contact resistance and devices performance. The relatively narrow distributions of electrical properties in the devices produced by the process of the invention are consistent with better control of the electrode profile in the first few nanometers above the surface.

The Table 1 data also shows that the field effect mobility consistently decreased with increasing contact resistance. The correlation coefficient for the linear fit is −0.90. Additionally, the intrinsic mobility obtained from the zero contact resistance intercept of the linear fit to data for bilayer lift-off process devices was $8.9 \times 10^{-4}$ cm$^2$/Vs at room temperature, which is comparable to the best values of mobility of bottom electrode CuPc organic thin film transistors with longer channels (12-25 μm) and thicker CuPc layers (50-60 nm). For ultrathin organic thin film transistors produced by the conventional process, an approximately exponential correlation between the field effect mobility and contact resistance was observed. The strong correlation between contact resistance and mobility is consistent with the contact resistance being the primary cause of reduced electrical performance in these ultrathin organic thin film transistors. The test results demonstrate that the invention provides ultrathin organic thin film transistors with significantly improved properties.

The generality of the method of FIGS. 3A-3F was validated by fabricating organic thin film transistors in four different phthalocyanines (CuPc, NiPc, H$_2$Pc and CoPc) and CuPc organic thin film transistors with 8 different channel thicknesses (4 ML to 1047 ML). The contact resistance values (mean+/−standard deviation) with different phthalocyanines are $9.6 \pm 3.9 \times 10^4$ ohm (CuPc 12 ML), $4.8 \pm 3.4 \times 10^4$ ohm (NiPc 12 ML), $2.5 \pm 0.7 \times 10^5$ ohm (H$_2$Pc 12 ML), and $1.4 \pm 1.4 \times 10^5$ ohm (CoPc 12 ML). The contact resistance values with different CuPc thicknesses are $3.9 \pm 3.9 \times 10^6$ ohm (4 ML), $9.6 \pm 3.9 \times 10^4$ ohm (12 ML), $1.60 \pm 0.4 \times 10^6$ ohm (36 ML), $1.20 \pm 0.6 \times 10^6$ ohm (100 ML), $5.4 \pm 2.6 \times 10^5$ ohm (150 ML), $6.4 \pm 1.4 \times 10^5$ ohm (250 ML), $6.9 \pm 0.9 \times 10^5$ ohm (494 ML), and $2.8 \pm 1.6 \times 10^5$ ohm (1047 ML) for the bilayer lift-off processed CuPc devices. The higher contact resistance of the 4 ML CuPc devices may be due to incomplete film coverage above the third layer or differences in film texture. As compared with the contact resistance on the conventionally processed electrodes ($1.8 \pm 2.1 \times 10^8$ ohm, CuPc 12 ML), the fabrication by the process of the invention of different phthalocyanines and different CuPc thicknesses decreased the contact resistance by between two and three orders of magnitude. All organic thin film transistors fabricated by the process of the invention also exhibited clear saturation behavior.

Regeneration to Counteract Aging

The effects of ambient induced aging were investigated for CuPc organic thin film transistors using thick (1000 ML) and ultrathin (4 ML) active layer channel thickness devices. Experiments determined that adsorption and diffusion processes involving strong ambient oxidants (e.g. NO$_x$) within the grain boundaries of the CuPc film are the most likely mechanism resulting in CuPc organic thin film transistor degradation. A regeneration process to counteract the electrical effects of aging through displacement of the strong oxidants is provided and experiments show its effectiveness.

In the aging and regeneration experiments, metal electrodes consisting of Ti (5 nm) and Au (45 nm) were patterned on heavily doped (100) n+ Si wafers (common gate) with thermally grown 100 nm SiO$_2$ (insulator) from Nova Electronic Materials, Ltd using photolighography using the FIGS. 3A-3F process. The two types of photoresist material with distinct etching rates were is (polymethylglutarimide (PMGI) mixture solution with equal volumes of pure PMGI SF13 and PMGI SF3 solutions to create about 300 nm high undercut layer as the bottom resist layer and Microposit® S1818 photoresist as the 2 μm high top resist layer). The electrodes consisted of 45 pairs of interdigitated gold fingers forming a 5 μm channel length and 2 mm channel width. Six pairs of electrodes were grown on each substrate to verify reproducibility and increase yield.

CuPc was purchased from Sigma-Aldrich and purified via multiple zone sublimations at 400° C. and $10^{-5}$ torr for over 50 h with a yield over 70%. CuPc films with 4 monolayers (MLs) and 1000 MLs thickness were deposited on chips with six organic thin film transistors devices per chip to assess reproducibility. The CuPc was deposited by organic molecular beam deposition (OMBD) in a UHV chamber with a base pressure of $1\times10^{-10}$ torr. The deposition rate of the CuPc films ranged from 0.3 to 0.5 Å/sec, and the deposition pressure was $1\times10^{-8}$ torr. Substrate temperature during deposition was held constant at 25° C.

Surface morphology was measured by atomic force microscopy (AFM) using a Nanoscope IV Scanning Microscope in tapping mode and a VEECO 200 kHz probe. The film thicknesses were measured during deposition with a quartz crystal microbalance, which was calibrated by atomic force microscopy and low angle XRD measurements using a Rigaku RU-200B diffractometer with Cu K$_\alpha$ radiation. XRD revealed the films to be textured a phase. The d spacing was 13.3 Å in accordance with previous measurements that show that the phthalocyanine molecules are oriented perpendicular to the substrate surface.

The organic thin film transistors were characterized at room temperature in an optically isolated probe station to minimize photocurrent using a voltage sweep rate of 2V/s. The DC electrical properties were determined from current-voltage (I-V) measurements. A total of four environments were utilized to investigate the aging and recovery processes: environment I—30% relative humidity with N$_2$; environment II—pure N$_2$; environment III—clean dry air (20% O$_2$, 80% N$_2$); environment I'—30% relative humidity with clean air. Water vapor was introduced into the enclosed probe station using a custom built flow system and dry N$_2$ or clean dry air were used as carrier gases. Bubblers filled with distilled water were immersed in a 15° C. constant temperature bath and mass flow controllers were used to maintain a constant flow rate of 500 sccm (standard cm$^3$ per minute) for each environment. Vapor pressure data was used with the Clausius-Clapeyron equation to calculate the concentration of water vapor in parts per million (ppm). A dose of 8440 ppm water vapor in N$_2$ or clean dry air carrier gas was used to create a relative humidity of roughly 30%.

Bottom electrode organic thin film transistors consistent with FIG. 3E were prepared with channel thicknesses of 4 ML and 1000 (±5%) ML CuPc films to investigate the effects of aging on films with different surface microstructure. The root-mean-square (RMS) roughnesses are 0.7 nm and 64.4 nm for 4 ML CuPc and 1000 ML CuPc films. The RMS roughness increases linearly with a slope of 0.06 nm/ML with film thickness. For the thicker films, the RMS roughness is only 5% of the film thickness consistent with a film of small densely packed crystallites separated by tall grain boundaries. The thick CuPc films have tall, high surface area grain boundaries which allow for more adsorption sites of oxidants (O$_2$, NO$_x$, O$_3$) from the ambient air than a thinner CuPc layer.

Figure 6B:
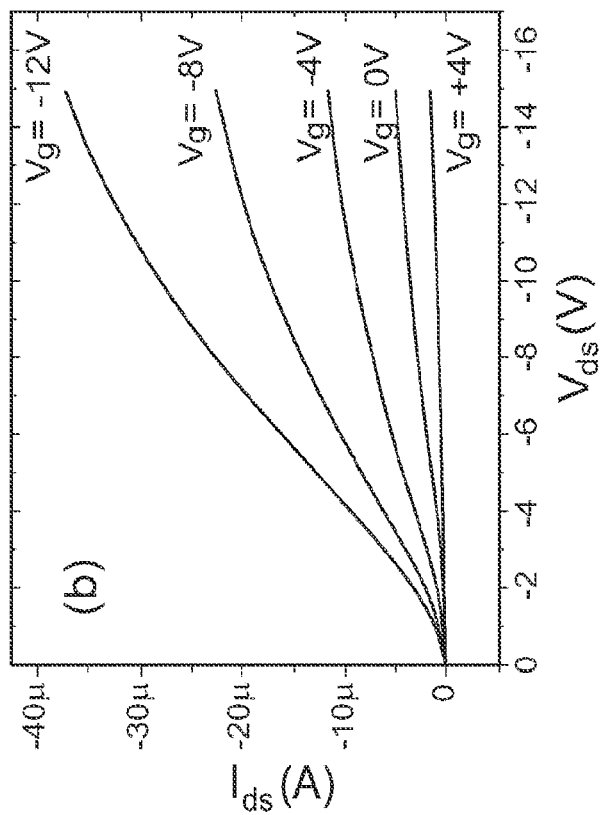
FIGS. 6A-6C shows characteristics of 4 ML organic thin film transistors and FIGS. 6D-6F show characteristics of 1000 ML organic thin film transistors with data from an aging and regeneration experiment.
Figure 6A:
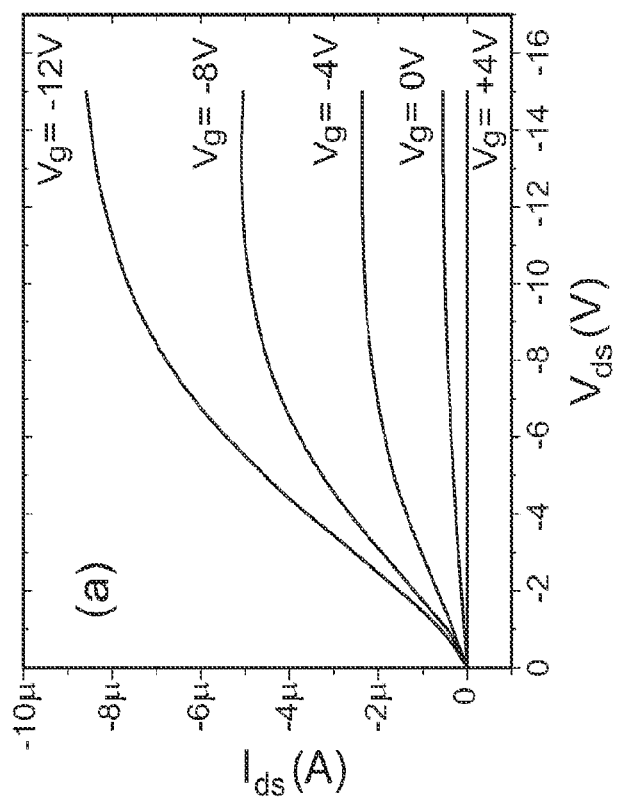
Figure 6D:
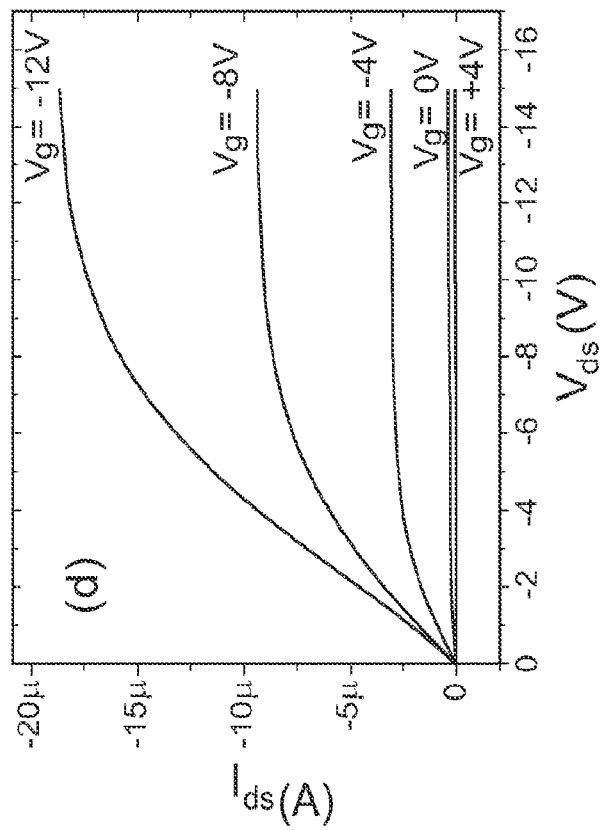
Figure 6C:
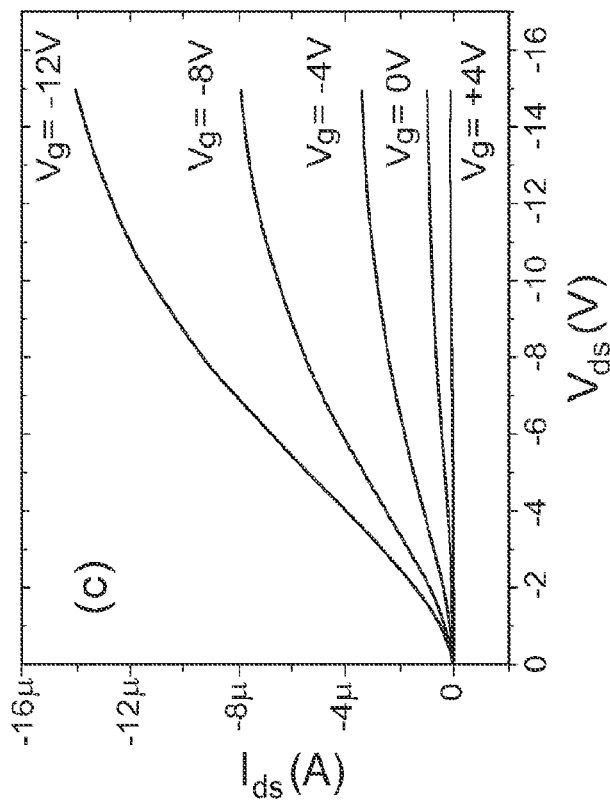
Figure 6F:
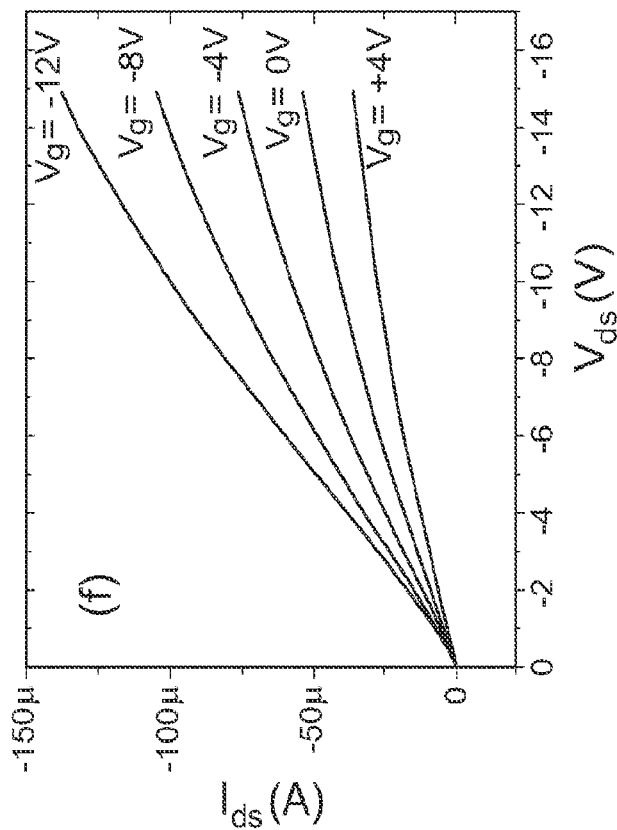
Figure 6E:
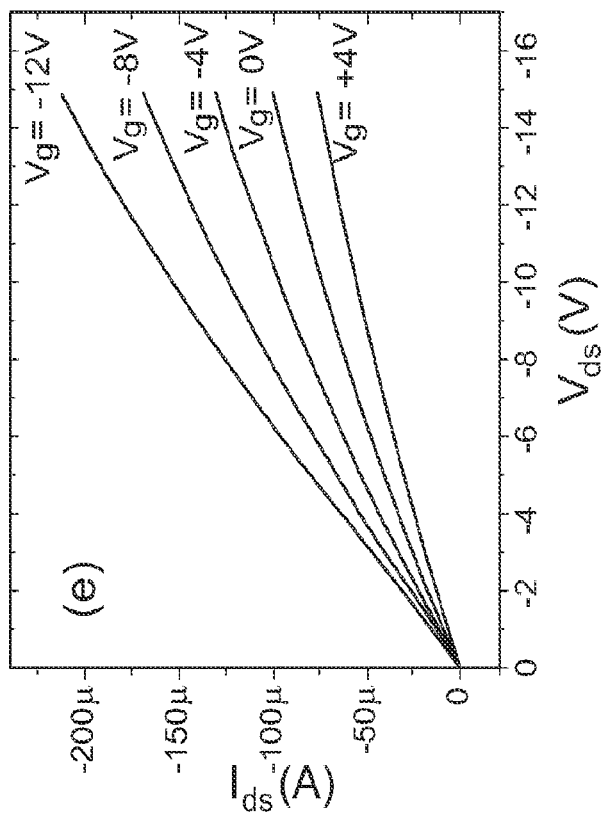

FIGS. 6A-6C shows characteristics of 4 ML organic thin film transistors and FIGS. 6D-6F show characteristics of 1000 ML organic thin film transistors with data from an aging and regeneration experiment. The FIGS. 6A and 6D devices are freshly prepared, the FIGS. 6B and 6E devices are aged for 14 days in ambient air, and the FIGS. 6C and 6F devices were kept in vacuum for 4 days after the ambient air exposure. The lower drain-source current of the 4 ML CuPc devices may be due to incomplete film coverage above the third layer or differences in film texture. After 14 days in ambient air, the drain-source currents significantly increased for both 4 ML (FIG. 6B) and 1000 ML (FIG. 6E) CuPc organic thin film transistors. The aging effects are evident in two obvious I-V characteristics: increased drain-source current at V$_g$=0V and degraded saturation behavior. The aging is more dramatic in the 1000 ML CuPc organic thin film transistors as seen in the output characteristics after 14 days in the ambient air (FIG. 6E). The correlation between the film thickness and the effects of aging is consistent with fixed charge and trap state formation resulting from ambient oxidants adsorbing in the grain boundaries.

To remove the traps and fixed charge, the devices were stored in a high vacuum ($10^{-7}$ torr) chamber for 4 days. After 4 days in a high vacuum chamber the 4 ML CuPc organic thin film transistor recovered its initial I-V characteristics as shown in FIG. 6C, while the 1000 ML CuPc organic thin film transistor retained poor I-V saturation behavior with a high threshold voltage as shown in FIG. 6F. The inability of high vacuum to induce desorption of the adsorbates causing aging is consistent with high fixed charge and trap densities that are known to form within the deep grain boundaries of the thicker films.

Figure 7:
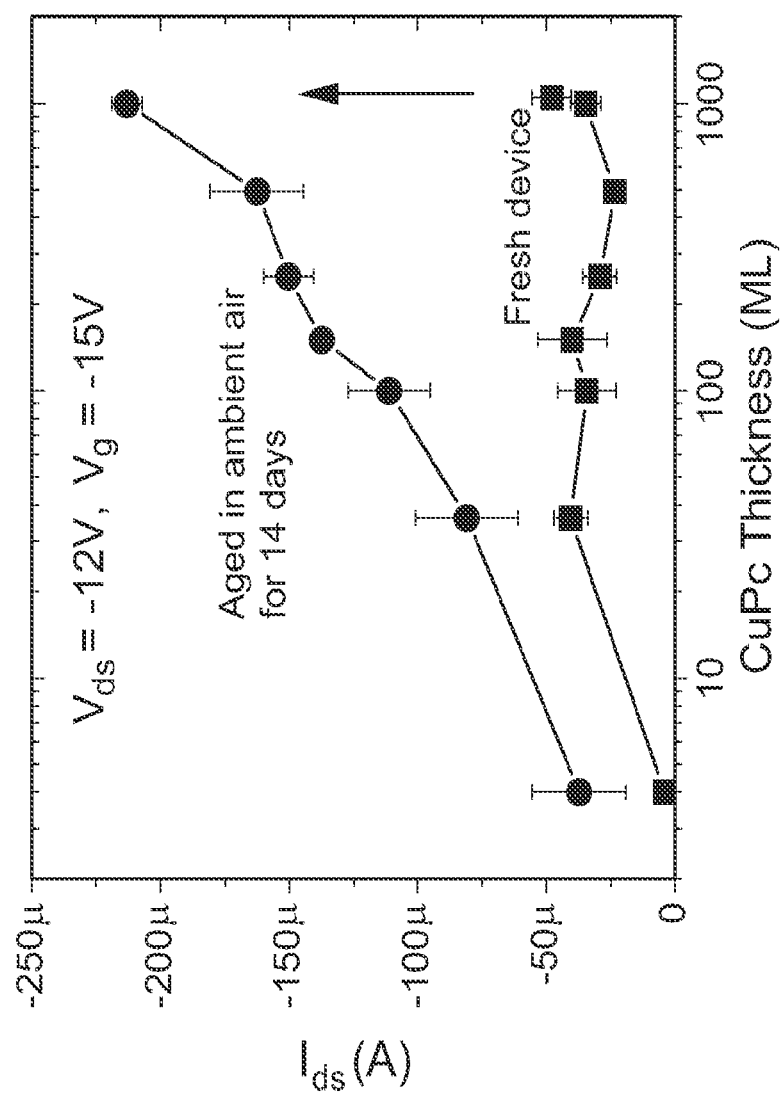
FIG. 7 plots the on-state current ($V_{ds}=-12V$, $V_g-15V$) of organic thin film transistors with different CuPc channel thickness before aging and after aging in ambient air for 14 days.

FIG. 7 plots the on-state current (V$_{ds}$=−12V, V$_g$=−15V) of organic thin film transistors with different CuPc channel thickness before aging and after aging in ambient air for 14 days. Before aging in ambient air the current-voltage characteristics are independent of CuPc thickness (30 ML to 1000 ML), which is consistent with a charge transport mechanism in which all the carriers conduct in the first few MLs near the gate dielectric. However, the on-state current of the aged organic thin film transistors monotonically increases with CuPc thickness, consistent with ambient oxidants adsorbing in grain boundaries and forming negative fixed charge and a high trap density in the film.

Figure 8A:
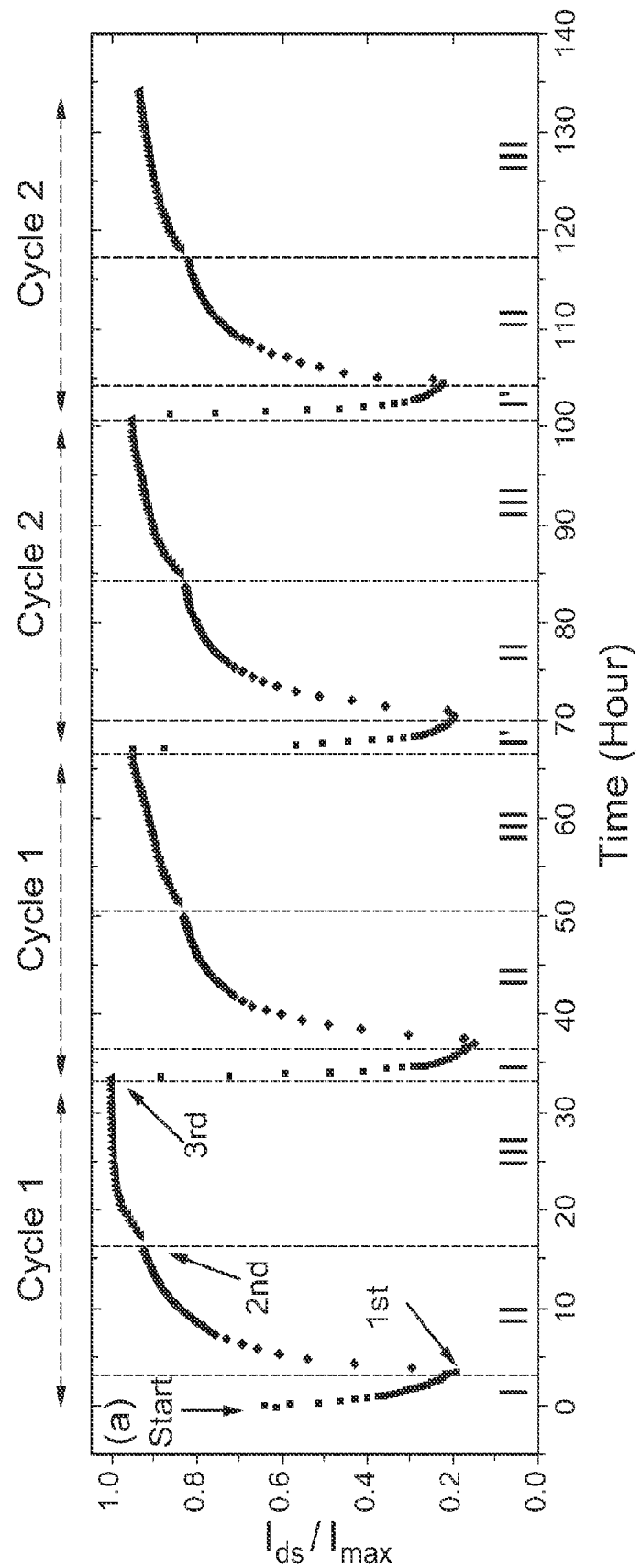
Figure 8B:
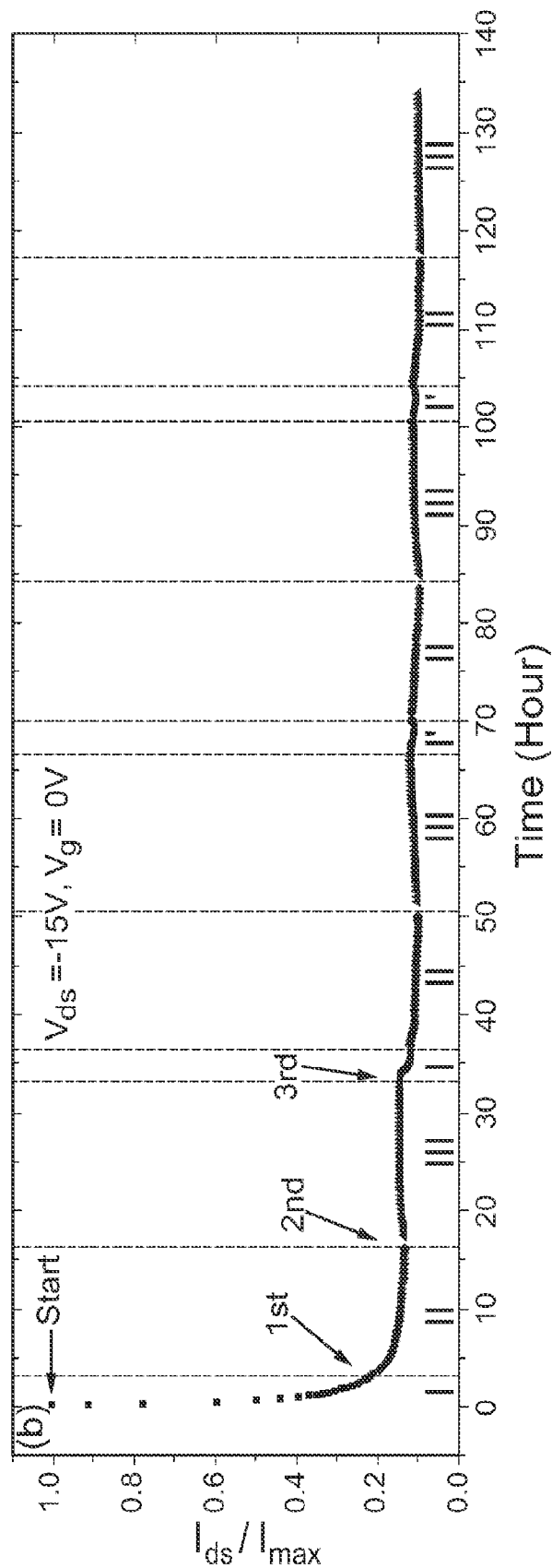

Thick CuPc devices exhibited the most dramatic effects of aging and were used for isolating the cause of aging in ambient air. Exposure of 1000 ML thick CuPc organic thin film transistors to two environment cycles isolated the causes of device degradation. FIGS. 8A-8F illustrate data from environmental cycle regeneration testing. FIG. 8A shows the on-state current (normalized to I$_{max}$=−2.33×10$^{-5}$ A) and FIG. 8B shows the off-state current (normalized to I$_{max}$=−1.1×10$^{-6}$ A) for the two different environment cycles. Cycle 1 employs three environments over 33.5 hours: environment I—30% relative humidity with N$_2$ (3.5 hrs); environment II—pure N$_2$ (13 hrs); environment III—clean dry air (17 hrs). Cycle 2 employs the same three environments with the exception that environment I is replaced with environment I'—30% relative humidity with clean air. The cycles were repeated to confirm reproducibility. Three devices were individually tested using identical exposure cycles. The on-state current at the end of the experiments had a deviation of less than 30%. The variability in on-state current is attributed to inconsistent ambient conditions which influence the initial output characteristics.

The off-state current is consistently reduced to negligibly small values following the initial exposure to clean humidified environments.

The effects of each environment can be summarized by the following: Environments I and I' initiate each cycle by decreasing the output current via the adsorption of water. Next, exposure to pure $N_2$ in environment II allows the desorption of water so the output current increases. Finally, exposure to dry air in environment III causes a further increase in output current due to doping by $O_2$. The results in FIG. 8A are consistent with the doping mechanism for p-type CuPc films. $O_2$ in clean dry air increases the CuPc film conductivity by acting as the primary dopant and $H_2O$ decreases conductivity acting as a counterdopant:

$$CuPc + O_2 \rightarrow CuPc^+ + O_2^- \qquad (1)$$

$$CuPc + H_2O \rightarrow CuPc^- + H_2O^+ \qquad (2)$$

Figure 8D:
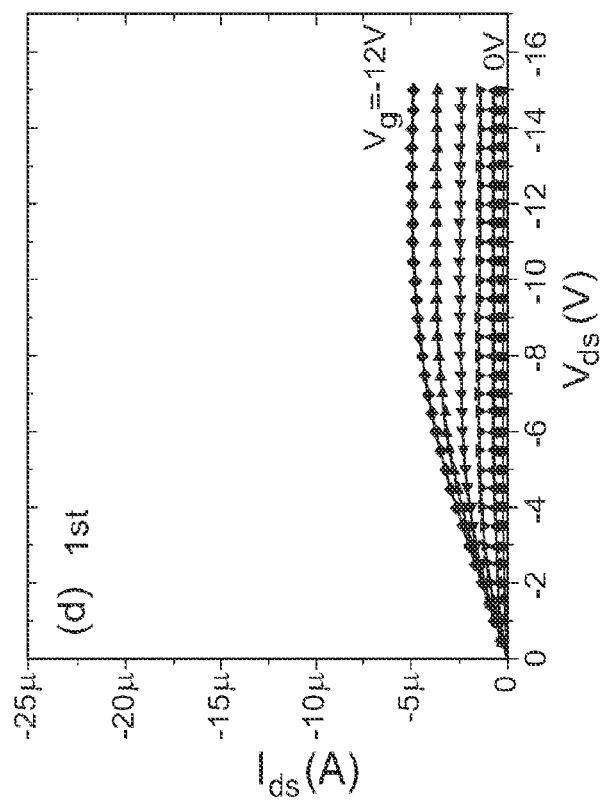
Figure 8C:
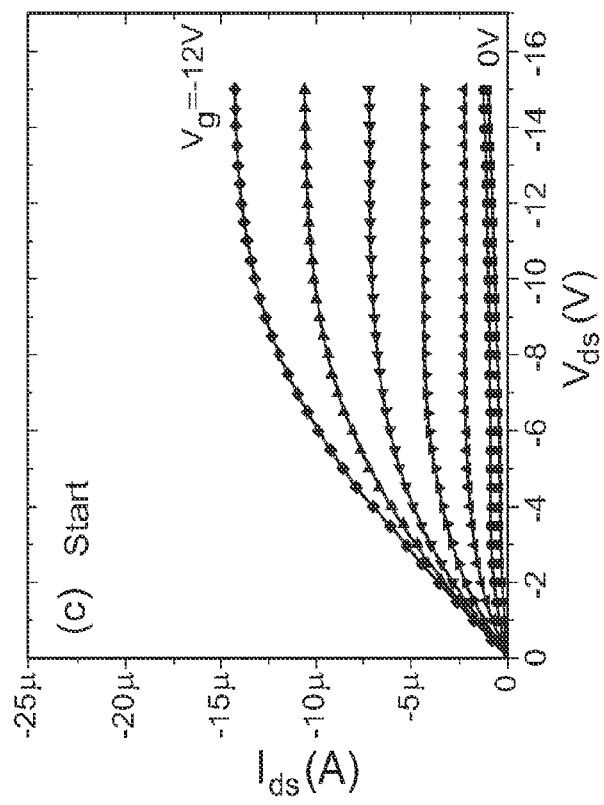

FIG. 8C at the starting point where devices have been in the ambient air for 45 minutes after deposition, labeled "start", FIG. 8D after exposure under environment I, labeled "$1^{st}$", FIG. 8E after exposure under environment II, labeled "$2^{nd}$", and FIG. 8F after exposure under environment III, labeled "$3^{rd}$". The gate voltage steps are in increments of −2V and the experiment was performed at room temperature. The sequence in FIGS. 8A and 8B is initiated using a device that had been exposed to ambient conditions for 45 minutes after CuPc deposition. By comparing FIGS. 8C and 8F it is apparent that the effects of aging are not only prevented, but reversed since FIG. 8C shows a higher off-state drain-source current at $V_g=0V$ than FIG. 8F. Similar output characteristics are obtained at the environment transitions for cycles 2-4. The well-behaved device characteristics demonstrated throughout the 4 cycles indicates that the large threshold voltage and poor saturation behavior in aged devices are due to trace strong oxidants (e.g. $O_3$ and $NO_x$) in ambient air and not due to any combination of $O_2$ and $H_2O$. Instead, it is likely that $H_2O$ displaces the trace strong oxidants thereby allowing only $O_2$ to dope the film in environment III.

Most adsorption sites are readily accessible to the gas molecules because they are located at the air/MPc interface at coherent and incoherent step edges, however there are also less accessible adsorption sites in grain boundaries. Water causes a decrease in current due to donation of electron pairs from water molecules to the p-type film, and diffusion of $H_2O$ in and out of grain boundaries is expected to be slow. Therefore, the 1000 ML organic thin film transistors require prolonged exposure in a water-free environment for full recovery from exposure to humid environments.

The experiments have shown that exposure to water vapor for a length of time proportional to the organic layer thickness (longer times for thicker layers) is a key to the reversal of aging since water is a strong binder and displaces strong oxidants via diffusion in grain boundaries. To demonstrate that humidified clean air can induce recovery from ambient exposure, aged 1000 ML CuPc organic thin film transistors were exposed to 30% relative humidity with clean air for 48 hours and clean dry air for 24 hours.

Figure 9B:
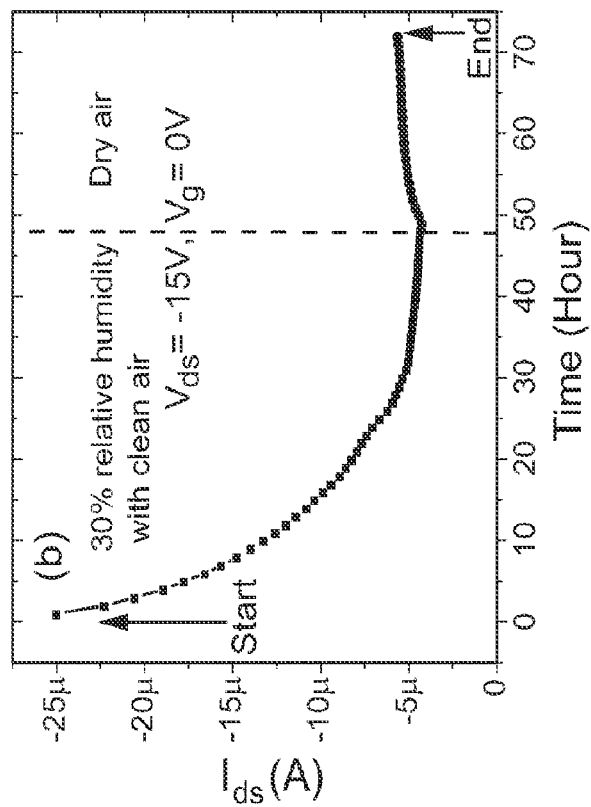
FIG. 9A-9D shows the results of water vapor exposure regeneration testing.
Figure 9A:
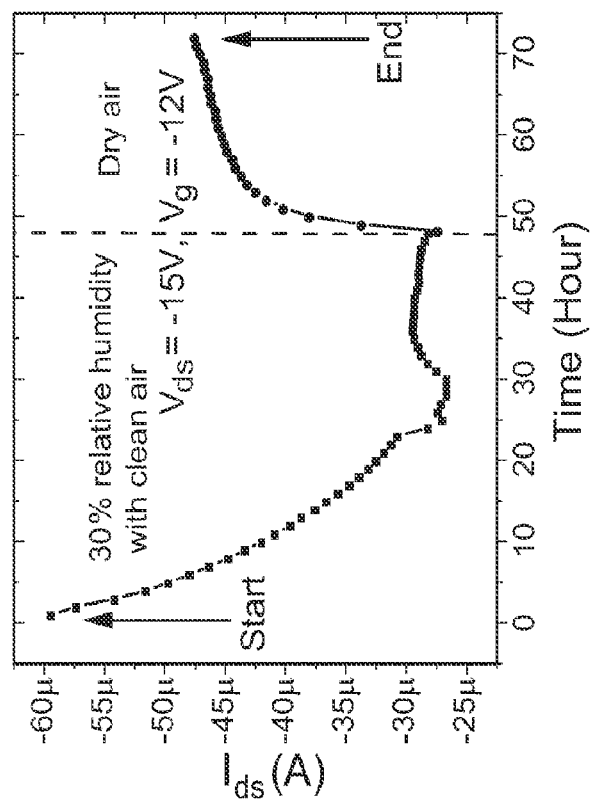
Figure 9D:
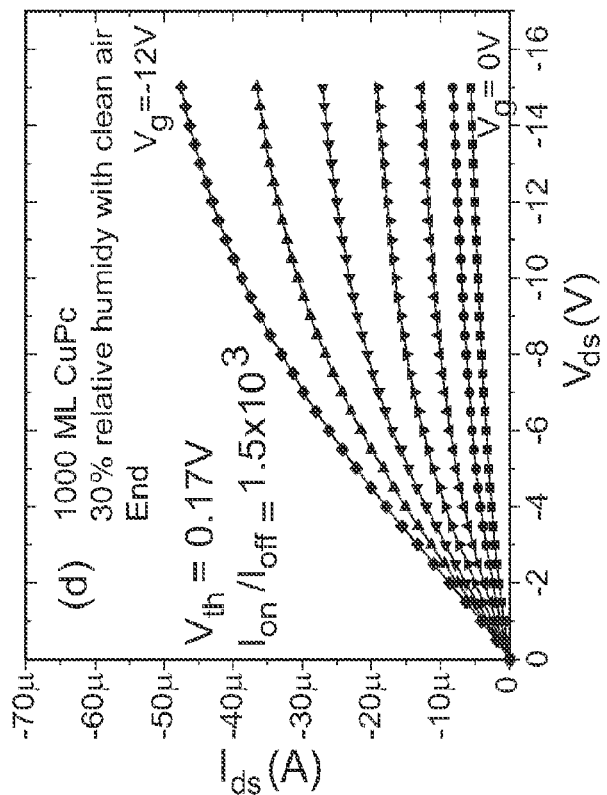
Figure 9C:
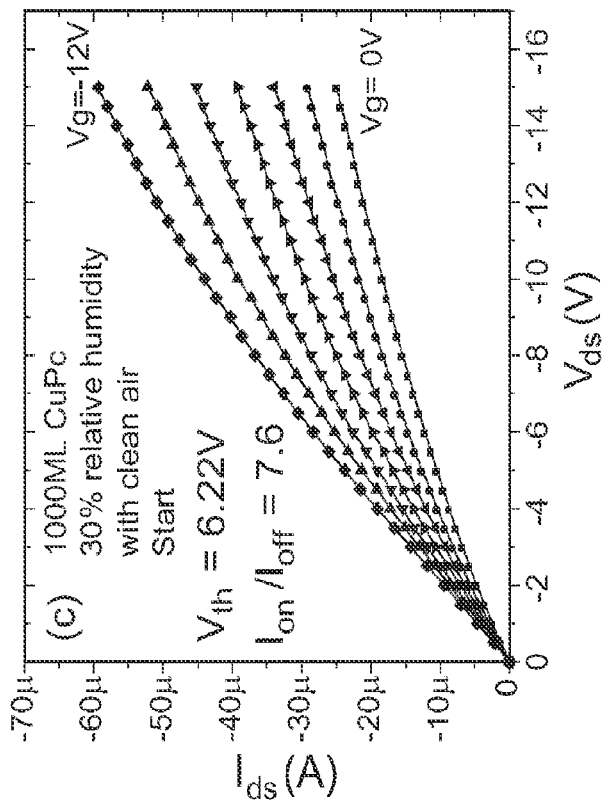

FIG. 9A-9D shows the results of water vapor exposure regeneration testing. FIG. 9A shows on-state current at $V_{ds}=-15V$, $V_g=-12V$ during the recovery test under 30% relative humidity with clean air for 48 hours and clean dry air for 24 hours. FIG. 9B shows off-state current at $V_{ds}=-15V$, $V_g=0V$ during the recovery test under 30% relative humidity with clean air for 48 hours and clean dry air for 24 hours. FIG. 9C shows output characteristics of aged 1000 ML CuPc organic thin film transistors under ambient air FIG. 9D shows output characteristics of aged 1000 ML CuPc organic thin film transistors after exposure under 30% relative humidity with clean air for 48 hours and clean dry air for 24 hours. The gate voltage steps are in increments of −2V and the experiment was performed at room temperature.

The FIG. 9C representative output characteristics for aged 1000 ML CuPc organic thin film transistors with the typical aging characteristics show a lack of current saturation and high drain-source current at $V_g=0V$. The device performance of the recovered 1000 ML CuPc organic thin film transistors in FIG. 9D after exposure to clean humidified and clean dry air (the long time for recovery is due to thick devices being employed) is clearly improved. Recovery was demonstrated on three aged devices with similar initial output characteristics; the deviation in saturation current between devices was less than 20% at both the beginning and end of the recovery sequence. After exposure to the clean controlled environments, the devices have relatively good saturation behavior even at high gate voltage and a low threshold voltage as shown in FIG. 9D. The recovery process was able to lower the threshold voltage by about 35× (from 6.22V to 0.17V), improve the on/off ratio by about 200× (from 7.6 to $1.5 \times 10^3$), and decrease the current slope at saturation by about 100× (from $2 \times 10^{-6}$ A/V to $7 \times 10^{-8}$ A/V at $V_g=-6V$). The mobility decreased by only 1.6× (from $1.1 \times 10^{-3}$ cm$^2$V$^{-1}$s$^{-1}$ to $0.7 \times 10^{-3}$ cm$^2$V$^{-1}$s$^{-1}$) following the recovery which is consistent with fixed charge primarily influencing the on/off ratio and threshold voltage in organic thin film transistors. The result shows that strong oxidant adsorption can be reversed by exposure to another strong chemisorbate such as $H_2O$.

Figure 10B:
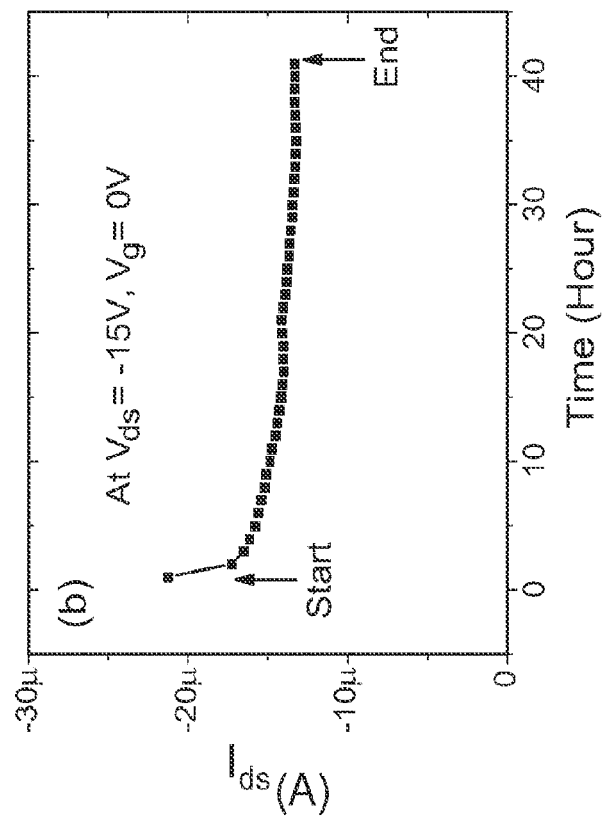
FIGS. 10A-10D show the results of tests that demonstrated that clean dry air failed to regenerate thin film transistor devices.
Figure 10A:
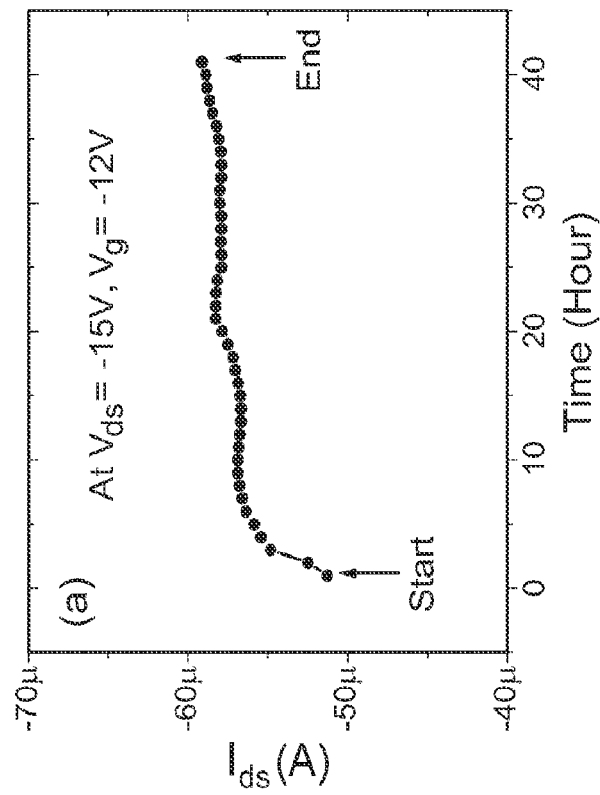
Figure 10D:
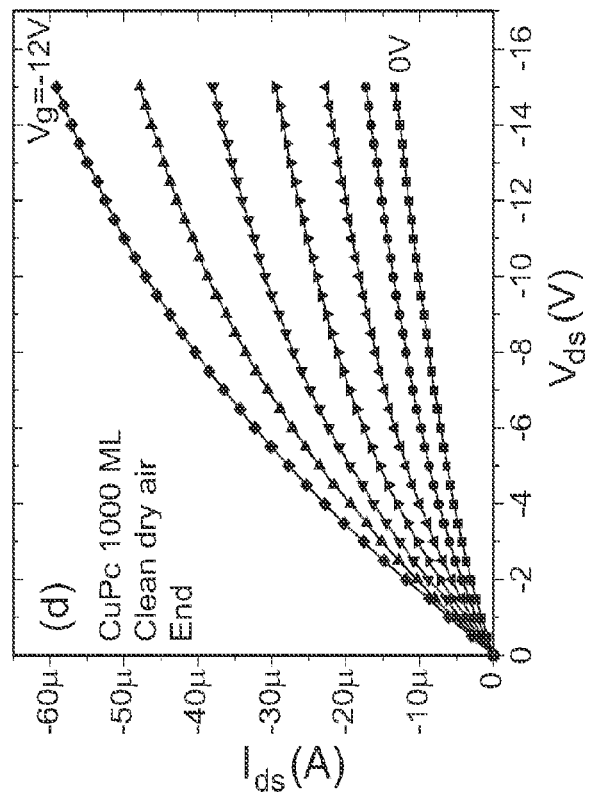
Figure 10C:
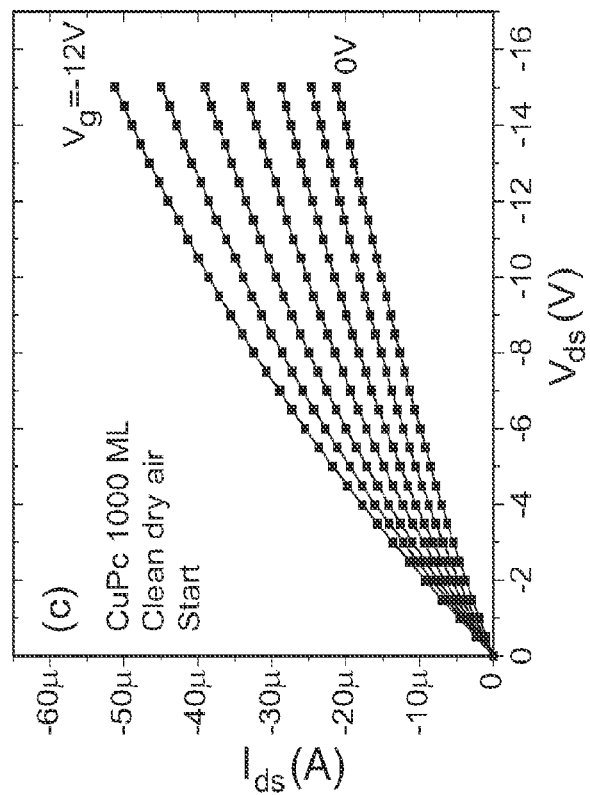

FIGS. 10A-10D show the results of tests that demonstrated that clean dry air failed to regenerate thin film transistor devices. Aged test devices exposed is to clean dry retained high threshold voltages and poor saturation at high gate voltages. FIG. 10A shows the drain-source current at $V_{ds}=-15V$, $V_g=-12V$ in clean dry air for 41 hours; FIG. 10B shows drain-source current at $V_{ds}=-15V$, $V_g=0V$ in clean dry air for 41 hours. FIG. 10C shows output characteristics of aged 1000 ML CuPc organic thin film transistors under ambient air. FIG. 10D shows output characteristics of aged 1000 ML CuPc organic thin film transistors after exposure to clean dry air for 41 hours. The drain-source current in clean dry air does not change significantly. The gate voltage steps are in increments of −2V and the experiment was performed at room temperature.

Figure 11B:
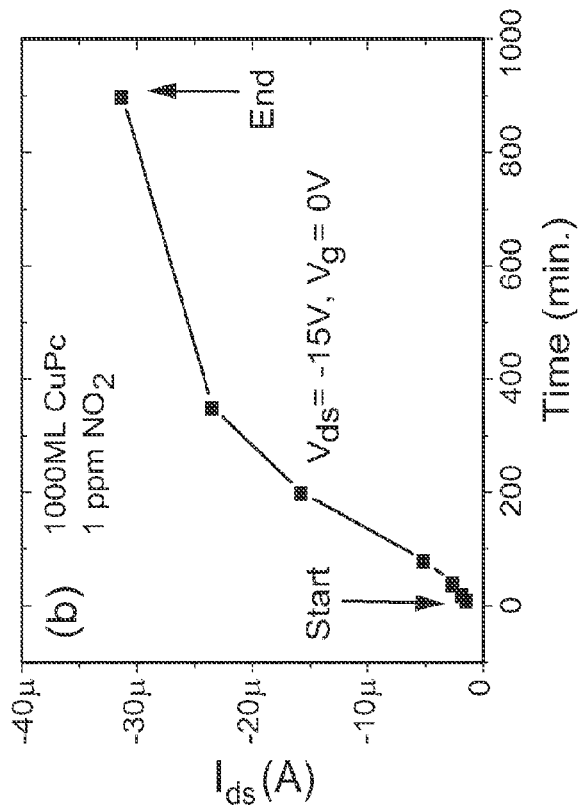
Figure 11A:
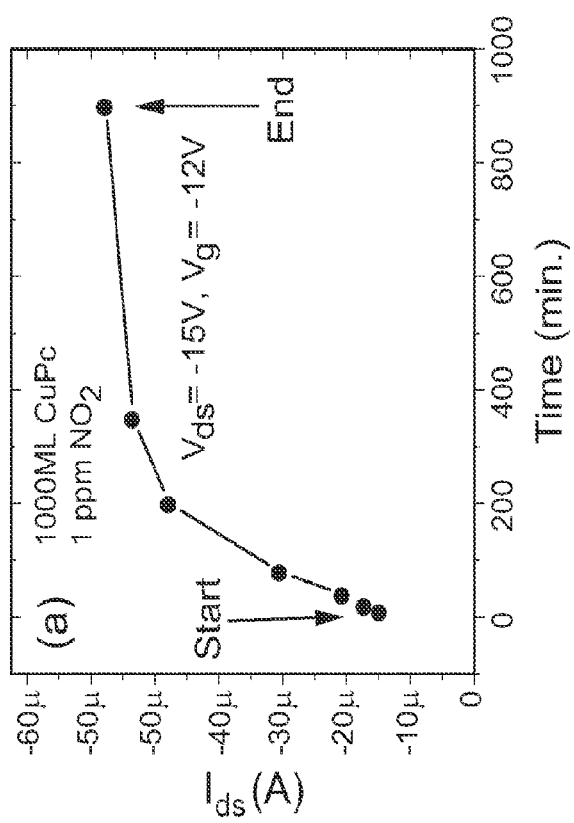

FIGS. 11A-11D shows the results of test that confirm that oxidents in air are responsible for aging of organic thin film transistors. FIG. 11A shows on-state current for 1000 ML a CuPc organic thin film transistor exposed to 1 ppm $NO_2$. FIG. 11B shows off-state current for a 1000 ML CuPc organic thin film transistor exposed to 1 ppm $NO_2$. FIG. 11C shows output characteristics of a fresh 1000 ML organic thin film transistor exposed to ambient conditions for ~10 min. FIG. 11D shows output characteristics of the same device after 900 min exposure to the 1 ppm $NO_2$ environment. The gate voltage steps are in increments of −2V and the experiment was performed at room temperature. To confirm that trace strong oxidants in ambient air are responsible for the aging process, 1000 ML CuPc organic thin film transistors were measured following exposure to a simulated ambient environment containing clean dry air and 10 ppm $NO_2$ in clean dry air (Airgas) in a 10:1 mixture, leading to a net $NO_x$ concentration of 1 ppm. It is noted that $NO_2$ exists as both a monomer and dimer and $NO_2$ gas usually contains NO so the gas is referred to as $NO_x$. Fresh devices had characteristic linear and saturation behavior of a well behaved organic thin film transistor, which was lost after exposure to 1 ppm $NO_x$ for 900 minutes (producing performance than was almost identical to the output characteristics for devices which have been exposed for two weeks to ambient air. The aging mechanism which is dependent on the level of strong oxidants ($NO_x$, and $O_3$) in the atmosphere. The aging process in ambient air is much more pronounced for thicker CuPc organic thin film transistors than thin CuPc organic ultrathin film transistors. While the output current at high gate voltage is independent of channel thickness between 4 ML and 1000 ML, after aging the output current scales with channel film thickness; this is consistent with aging being due to adsorption of trace oxidants (for example $O_3$ and $NO_x$) at grain boundaries causing an increase in fixed charge and trap states. The adsorption of the strong oxidant is reversible since the aged devices can be restored to proper working behavior by prolonged exposure to humidified clean air.

A particular application of the regeneration technique is for the manufacture of organic light emitting diode (OLED) displays. By performing regeneration immediately prior to sealing of the OLED display, the transistor performance can be improved. This can permit large scaling as the process of manufacture needn't be sped up to avoid the aging of the transistors that are exposed to oxidants.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for forming a thin film electrode for an organic thin film transistor, comprising:
    depositing a first layer of photoresist on a substrate, the photoresist of the first layer having a first etching rate;
    depositing a second layer of photoresist on the first layer of photoresist, the photoresist of the second layer having a second etching rate that is lower than the first etching rate;
    patterning the first and second layer of photoresist by exposure;
    developing the first and second layers of photoresist to provide an electrode area on the substrate;
    depositing an electrode in the electrode area;
    performing lift-off of the first and second layers.

2. A method for forming an organic thin film transistor, comprising:
    forming a plurality of thin film electrodes according to the method of claim 1; and
    depositing an organic thin film semiconductor over the thin film electrodes.

3. The method of claim 2, wherein the substrate has a thin dielectric layer upon which the electrodes are deposited.

4. The method of claim 3, wherein said substrate has a bottom electrode on an opposite side of the substrate from the thin film electrodes.

5. The method of claim 2 wherein the step of depositing an organic thin film semiconductor deposits the organic thin film semiconductor in a thickness of approximately 4 to 12 monolayers.

6. The method of claim 2, wherein the step of depositing an organic thin film semiconductor deposits the organic thin film semiconductor in a thickness of approximately 4 atomic or molecular monolayers or less.

7. The method of claim 2, wherein the step of depositing an organic thin film semiconductor deposits the organic thin film semiconductor in a thickness of approximately 1000 monolayer or less.

8. The method of claim 2, wherein the organic thin film semiconductor comprises one of copper phthalocyanine (CuPc), $CuC_{32}N_8H_{16}$), cobalt phthalocyanine (CoPc), $CoC_{32}N_8H_{16}$, metal-free phthalocyanine ($H_2Pc$), $C_{32}N_8H_{18}$, CuPc, and Copper-Hexadecafluorophthalocyanine ($F_{16}CuPc$ or $F_{16}CuC_{32}N_8H_{16}$).

9. The method of claim 1, wherein the first layer of photoresist comprises polymethylglutarimide (PMGI) and the second layer of photoresist comprises Microposit® S1805.

10. A method for forming an organic thin film transistor, comprising:
    providing a multi-layer mask on a substrate with an electrode area opening in a top layer of the mask being smaller than openings in other layers of the mask;
    depositing a thin film of metal in the electrode area on the substrate;
    removing the multi-layer mask; and
    depositing an organic thin film semiconductor over the thin film electrodes.

11. The method of claim 10, said mask including includes a plurality of electrode area openings, said depositing a thin film of metal is in a plurality of electrode areas and said depositing an organic film forms a plurality of thin film transistors.

12. The method of claim 10, wherein the substrate has a thin dielectric layer upon which the electrodes are deposited.

13. The method of claim 12, wherein the substrate has a bottom electrode on an opposite side of the substrate from the thin film electrodes.

14. The method of claim 10, wherein the step of depositing an organic thin film semiconductor deposits the organic thin film semiconductor in a thickness of approximately 4 to 12 monolayers.

15. The method of claim 10, wherein the step of depositing an organic thin film semiconductor deposits the organic thin film semiconductor in a thickness of approximately 4 atomic or molecular monolayers or less.

16. The method of claim 10, wherein the step of depositing an organic thin film semiconductor deposits the organic thin film semiconductor in a thickness of approximately 1000 monolayer or less.

17. The method of claim 10, wherein the organic thin film semiconductor comprises one of copper phthalocyanine (CuPc), $CuC_{32}N_8H_{16}$), cobalt phthalocyanine (CoPc), $CoC_{32}N_8H_{16}$, metal-free phthalocyanine ($H_2Pc$), $C_{32}N_8H_{18}$, CuPc, and Copper-Hexadecafluorophthalocyanine ($F_{16}CuPc$ or $F_{16}CuC_{32}N_8H_{16}$).

18. A method for forming an organic thin film transistor, comprising:
    depositing a first layer of photoresist on a substrate, the photoresist of the first layer having a first etching rate;
    depositing a second layer of photoresist on the first layer of photoresist, the photoresist of the second layer having a second etching rate that is lower than the first etching rate;
    patterning the first and second layer of photoresist by exposure;
    developing the first and second layers of photoresist to provide an electrode area on the substrate;
    depositing an electrode in the electrode area;
    performing lift-off of the first and second layers; and
    depositing an organic thin film semiconductor over the thin film electrode.

19. A method for forming an organic thin film transistor, comprising:

provide an n$^+$ Si substrate with a thermally grown SiO$_2$ to serve as a common gate and gate dielectric, respectively;

depositing a first layer of photoresist on the gate dielectric, the photoresist of the first layer having a first etching rate;

depositing a second layer of photoresist on the first layer of photoresist, the photoresist of the second layer having a second etching rate that is lower than the first etching rate;

patterning the first and second layer of photoresist by exposure to define a transistor channel length between source and drain electrode areas;

depositing source and drain electrodes in the source and drain electrode areas;

performing lift-off of the first and second layers; and depositing an organic thin film semiconductor over the source and drain electrode areas and a channel region between the source and drain electrode areas.

20. The method of claim 19, wherein said source and drain electrodes are deposited via electron beam evaporation by first forming a Ti adhesion layer and then depositing an Au contact layer.

21. The method of claim 19, wherein the transistor channel length is ~5 μm and the total thickness of the source and drain electrodes is ~50 nm.

22. The method of claim 19, wherein the organic thin film semiconductor comprises one of copper phthalocyanine (CuPc), CuC$_{32}$N$_8$H$_{16}$), cobalt phthalocyanine (CoPc), CoC$_{32}$N$_8$H$_{16}$, metal-free phthalocyanine (H$_2$Pc), C$_{32}$N$_8$H$_{18}$, CuPc, and Copper-Hexadecafluorophthalocyanine (F$_{16}$CuPc or F$_{16}$CuC$_{32}$N$_8$H$_{16}$).

* * * * *

UNITED STATES PATENT AND TRADEMARK OFFICE
CERTIFICATE OF CORRECTION

PATENT NO.        : 8,637,344 B2
APPLICATION NO.   : 12/936586
DATED             : January 28, 2014
INVENTOR(S)       : Andrew C. Kummell It is certified that error appears in the above-identified patent and that said Letters Patent is hereby corrected as shown below:

In the Specification:

| | |
|---|---|
| Col. 3, line 28 | After "fabricated", please insert --.--. |
| Col. 4, line 2 | Before "electrode in", please delete "is". |
| Col. 5, line 24 | Please delete "organic thin film transistors". |
| Col. 6, line 60 | Please delete "a thin film" and insert --an-- therefor. |
| Col. 6, line 62 | Before "thin film channel", please delete "an" and insert --a-- therefor. |
| Col. 9, line 58 | After "on-current", please delete ",". |
| Col. 9, line 65 | Please delete "devices" and insert --device-- therefor. |
| Col. 11, line 5 | After "were", please delete "is". |
| Col. 11, line 5 | Before "polymethylglutarimide", please delete "(". |
| Col. 12, line 3 | Please delete "shows" and insert --show-- therefor. |
| Col. 13, line 59 | Please delete "FIG. 9A-9D shows" and insert --FIGS. 9A-9D show-- therefor. |
| Col. 14, line 46 | Please delete "shows" and insert --show-- therefor. |
| Col. 15, line 1 | Please delete "than" and insert --that-- therefor. |
| Col. 15, line 3 | After "air", please insert --)--. |
| Col. 15, line 3 | After "mechanism", please delete "which". |

In the Claims:

| | |
|---|---|
| Col. 16, line 24, Claim 11 | After "including", please delete "includes". |
| Col. 16, line 45, Claim 16 | Please delete "monolayer" and insert --monolayers-- therefor. |

Signed and Sealed this
Twenty-fifth Day of November, 2014

Michelle K. Lee
*Deputy Director of the United States Patent and Trademark Office*